(12) United States Patent
Xiao et al.

(10) Patent No.: US 11,647,679 B2
(45) Date of Patent: May 9, 2023

(54) LOGIC COMPUTING

(71) Applicant: FUDAN UNIVERSITY, Shanghai (CN)

(72) Inventors: Jiang Xiao, Shanghai (CN); Weichao Yu, Shanghai (CN); Jin Lan, Shanghai (CN)

(73) Assignee: FUDAN UNIVERSITY, Shanghai (CN)

( * ) Notice: Subject to any disclaimer, the term of this patent is extended or adjusted under 35 U.S.C. 154(b) by 1 day.

(21) Appl. No.: 17/395,015

(22) Filed: Aug. 5, 2021

(65) Prior Publication Data

US 2021/0367141 A1 Nov. 25, 2021

Related U.S. Application Data

(60) Division of application No. 16/420,067, filed on May 22, 2019, now abandoned, which is a continuation of
(Continued)

(30) Foreign Application Priority Data

Aug. 10, 2018 (CN) .......................... 201810913713.5

(51) Int. Cl.
*G11C 11/16* (2006.01)
*H01F 10/32* (2006.01)
(Continued)

(52) U.S. Cl.
CPC ......... *H10N 50/80* (2023.02); *H01F 10/3277* (2013.01); *H03K 19/16* (2013.01);
(Continued)

(58) Field of Classification Search
CPC .................................................... H01L 43/02
See application file for complete search history.

(56) References Cited

U.S. PATENT DOCUMENTS

| 5,546,337 A | 8/1996 | Hurt et al. |
| 8,614,014 B2 * | 12/2013 | Lee ...................... G11B 5/7368 365/81 |

(Continued)

FOREIGN PATENT DOCUMENTS

| CN | 101145571 A | 3/2008 |
| CN | 104464758 A | 3/2015 |

(Continued)

OTHER PUBLICATIONS

The World Intellectual Property Organization (WIPO) Interational Search Report and Written Opinion for PCT/CN2018/115134 dated May 9, 2019 12 Pages.

(Continued)

*Primary Examiner* — Douglas King
(74) *Attorney, Agent, or Firm* — Anova Law Group, PLLC

(57) ABSTRACT

A computing device including a logic track including two logic-track magnetic domains separated by a logic-track domain wall, an input track arranged crossing the logic track at a first position of the logic track, and an output track arranged crossing the logic track at a second position of the logic track near the logic-track domain wall. The input track includes at least one input-track magnetic domain, and each of the at least one input-track magnetic domain includes at least one input-track storage unit configured to store binary 0 or 1. The output track includes at least one output-track magnetic domain, and each of the at least one output-track magnetic domain includes at least one output-track storage unit configured to store binary 0 or 1.

20 Claims, 12 Drawing Sheets

Related U.S. Application Data application No. PCT/CN2018/115134, filed on Nov. 13, 2018.

(51) Int. Cl.
  *H03K 19/16* (2006.01)
  *H03K 19/20* (2006.01)

(52) U.S. Cl.
  CPC .............. *H03K 19/20* (2013.01); *H10B 61/00* (2023.02); *G11C 11/161* (2013.01); *G11C 11/1673* (2013.01); *G11C 11/1675* (2013.01)

(56) References Cited

U.S. PATENT DOCUMENTS

| | | | |
|---|---|---|---|
| 9,236,106 B2* | 1/2016 | Nakamura | G11C 11/1675 |
| 2007/0195588 A1 | 8/2007 | Kim et al. | |
| 2007/0198618 A1* | 8/2007 | Kim | G11C 19/0808 |
| | | | 708/130 |
| 2008/0068880 A1 | 3/2008 | Lim et al. | |
| 2011/0075476 A1* | 3/2011 | Kajiwara | G11C 11/1675 |
| | | | 365/170 |
| 2013/0155754 A1 | 6/2013 | Apalkov et al. | |
| 2014/0043061 A1 | 2/2014 | Behin-Aein | |
| 2016/0203835 A1 | 7/2016 | Lin et al. | |
| 2017/0069831 A1 | 3/2017 | Nikonov et al. | |
| 2018/0075896 A1 | 3/2018 | Alaoui | |

FOREIGN PATENT DOCUMENTS

| | | |
|---|---|---|
| CN | 104766621 A | 7/2015 |
| CN | 105514260 A | 4/2016 |
| CN | 106030840 A | 10/2016 |
| CN | 108279065 A | 7/2018 |
| EP | 3082129 A1 | 10/2016 |
| KR | 20110091384 A | 8/2011 |

OTHER PUBLICATIONS

Lan et al., Antiferromagnetic domain wall as spin wave polarizer and retarder, Nature Communications, Aug. 2, 2017, p. 1-7.
Yu et al., Polarization-selective spin wave driven domain-wall motion in antiferromagnets, Physsical Review B 98, 144422 (2018), Oct. 15, 2018.
M. Lundstrom, Moore's Law Forever?, Science 299, 210-211 (2003).
Theis et al., The End of Moore's Law: A New Beginning for Information Technology, IEEE Educational Activities Department, (2017), pp. 41-50.
I. L. Markov, Limits on fundamental limits to computation. Nature 512, 147 (2014).
Chappert et al., The emergence of spin electronics in data storage, Nature Materials 6, 813 (2007), pp. 813-823.
Chumak et al., Magnon spintronics, Nature Physics 11, 453 (2015), pp. 453-461.
Kajiwara et al., Transmission of electrical signals by spin-wave interconversion in a magnetic insulator, Nature 464, 262 (2010), pp. 262-267.
H. S. Stone, A Logic-in-Memory Computer, IEEE Computer Society, 1970, pp. 73-78.
Thomas et al. Racetrack Memory: a high-performance, low-cost, non-volatile memory based on magnetic domain walls, (2011), IEDM11-538. pp. 24.2.1-24.2.4.

Parkin et al., Memory on the racetrack, Nature Nanotechnology, vol. 10, (2015), pp. 195-198.
Parkin et al, Magnetic Domain-Wall Racetrack Memory, Science 320, (2008), pp. 190-194.
Bode et al., Atomic spin structure of antiferromagnetic domain walls, Nature Materials 5, (2006), pp. 477-481.
Duine et al., Synthetic antiferromagnetic spintronics, Nature Physics 14, (2018), pp. 217-219.
Yang et al., Domain-wall velocities of up to 750 m s-1 driven by exchange-coupling torque in synthetic antiferromagnets, Nature Nanotechnology 10, (2015), pp. 221-226.
Parkin et al., Oscillations in exchange coupling and magnetoresistance in metallic superlattice structures: Co/Ru, Co/Cr, and Fe/Cr, Physical Review Letters 64, (1990), pp. 2304-2307.
Lan et al., Spin-Wave Diode, Physical Review X 5, (2015), pp. 041049-1-041049-7.
Chumak et al., Magnon transistor for all-magnon data processing, Nature Communications 5, 4700 (2014), pp. 1-8.
Klingler et al., Spin-wave logic devices based on isotropic forward volume magnetostatic waves, Applied Physics Letters 106, 212406 (2015).
Kanazawa et al., The role of Snell's law for a magnonic majority gate, Scientific Reports 7, 7898 (2017), pp. 1-8.
Klingler et al., Design of a spin-wave majority gate employing mode selection, Applied Physics Letters 105, 152410 (2014).
Khitum et al., Magnonic logic circuits, Journal of Physics D: Applied Physics 43, 264005 (2010), pp. 1-10.
Feffer et al., Theory of Antiferromagnetic Resonance, Physical Review 85, (1952), pp. 329-337.
Cheng et al., Spin Pumping and Spin-Transfer Torques in Antiferromagnets, Physical Review Letters 113, 057601 (2014), 057601-01-057601-5.
Cheng et al., Antiferromagnetic Spin Wave Field-Effect Transistor. Scientific Reports 6, 24223 (2016), pp. 1-6.
Lan et al., Antiferromagnetic domain wall as spin wave polarizer and retarder, Nature Communications 8, 178 (2017), pp 1-7.
Yu et al, Antiferromagnetic domain wall motion driven by polarized spin waves, arXiv:1711.08929 [cond-mat], (2017) pp. 144422-1-144422-7.
I. Dzyaloshinsky, A thermodynamic theory of "weak" ferromagnetism of antiferromagnetics, Journal of Physics and Chemistry of Solids 4, (1958), pp. 241-255.
T. Moriya, Anisotropic Superexchange Interaction and Weak Ferromagnetism, Physical Review 120, (1960), pp. 91-98.
Yan et al., All-Magnonic Spin-Transfer Torque and Domain Wall Propagation, Physical Review Letters 107, (2011), pp. 177207-1-177207-5.
Jungwirth et al., Antiferromagnetic spintronics, Nature Nanotechnology 11, (2016), pp. 231-241.
Garg et al., Dramatic influence of curvature of nanowire on chiral domain wall velocity. Science Advances 3, e1602804 (2017), pp. 1-7.
Fernandez-Pacheco et al., Magnetic State of Multilayered Synthetic Antiferromagnets during Soliton Nucleation and Propagation for Vertical Data Transfer, Advanced Materials Interfaces 3, (2016), pp. 1-7.
Lavrijsen et al., Magnetic ratchet for three-dimensional spintronic memory and logic, Nature 493, (2013), pp. 647-650.
The State Intellectual Property Office of People's Republic of China First Office Action for Application No. 201810913713.5 dated Apr. 13, 2020 33 pages (including translation).
United States Patent and Trademark Office Non Final Office Action for Application No. 16420067 dated Apr. 5, 2021 16 pages.

* cited by examiner

LOGIC COMPUTING

CROSS-REFERENCE TO RELATED APPLICATIONS

This application is a division of application Ser. No. 16/420,067, filed on May 22, 2019, which is a continuation of International Application No. PCT/CN2018/115134, filed on Nov. 13, 2018, which claims priority to Chinese Application No. 201810913713.5, filed on Aug. 10, 2018, the entire contents of all of which are incorporated herein by reference.

TECHNICAL FIELD

The present disclosure relates to logic computing technology and, more particularly, to a spin wave control device, a method for controlling a polarized spin wave, a computing device, a processing device, and a method for logic computing.

BACKGROUND

With the development of the metal-oxide-semiconductor field-effect transistor (MOSFET) miniaturization, the shrinking of transistors enables hundreds of millions of transistors to be placed on a single chip to increase the computing capabilities. However, the shrinking of transistors causes an enormous energy dissipation. Furthermore, the conventional silicon technologies utilize the von-Neumann computing architecture in which the data storage and data processing are separately implemented in a memory and a central processing unit. The memory and the central processing unit communicate via a data bus. This separating architecture decreases the computing speed and the energy efficiency, and also causes the computation volatile.

Memories based on spintronics, such as spin-transfer torque magnetic random-access memories (STT-MRAMs) and magnetic racetrack memories, have been developed for mitigating the energy issues without affecting the speed. However, the existing spintronic applications are limited to data storage only and the spin current carried by the conduction electrons is generally used for data storage, thus the Joule heating problem have not been completely avoided.

SUMMARY

In accordance with the disclosure, there is provided a spin wave control device including a first magnetic layer, a second magnetic layer arranged above the first magnetic layer, and a capping layer overlapping a portion of the second magnetic layer or a portion of the first magnetic layer. The first magnetic layer has a magnetization pointing in a first direction and the second magnetic layer has a magnetization pointing in a second direction that is approximately opposite to the first direction. The capping layer has a magnetization pointing approximately in the first direction or approximately in the second direction.

In some embodiments, the spin wave control device further includes a first spacer layer sandwiched between the first magnetic layer and the second magnetic layer and a second spacer layer sandwiched between the second magnetic layer and the capping layer.

In some embodiments, the capping layer is configured to rotate a polarization of a polarized spin wave injected into the spin wave control device.

In some embodiments, a rotation direction of the polarization of the polarized spin wave depends on a direction of the magnetization of the capping layer.

In some embodiments, a rotation angle of the polarization of the polarized spin wave depends on at least one of a length of the capping layer, a thickness of the first spacer layer, a thickness of the second spacer layer, a frequency of the polarized spin wave, or material properties of the first magnetic layer and the second magnetic layer. A length direction of the capping layer is approximately parallel to a propagation direction of the polarized spin wave in the spin wave control device.

In some embodiments, the second magnetic layer and the first magnetic layer have an approximately same width.

In some embodiments, a direction of the magnetization of the capping layer is configured to switch between aligning approximately with the first direction and aligning approximately with the second direction.

In some embodiment, the spin wave control device further includes a switching device coupled to the capping layer and configured to switch the direction of the magnetization of the capping layer.

In some embodiments, the first direction and the second direction are approximately perpendicular to an upper surface of the second magnetic layer or approximately perpendicular to a side surface of the second magnetic layer.

In some embodiments, the first magnetic layer and the second magnetic layer include a same material or a same structure, and a total magnetization of the first magnetic layer is same as a total magnetization of the second magnetic layer.

In some embodiments, each of the first magnetic layer and the second magnetic layer includes at least one of iron (Fe), nickel (Ni), cobalt (Co), chromium (Cr), or yttrium iron garnet (YIG), and the capping layer includes at least one of iron (Fe), nickel (Ni), cobalt (Co), chromium (Cr), or yttrium iron garnet (YIG).

Also in accordance with the disclosure, there is provided a method for controlling a polarized spin wave including injecting the polarized spin wave into a synthetic antiferromagnet (SyAF) and controlling a magnetization direction of a capping layer to rotate a polarization of the polarized spin wave. The capping layer overlaps a portion of the SyAF.

In some embodiments, the SyAF includes a first magnetic layer having a magnetization pointing in a first direction, and a second magnetic layer arranged above the first magnetic layer and having a magnetization pointing in a second direction that is approximately opposite to the first direction. Controlling the magnetization direction of the capping layer to rotate the polarization of the polarized spin wave includes: controlling the magnetization direction of the capping layer to align approximately with the first direction to cause the polarization of the polarized spin wave to be rotated in a first rotation direction, or controlling the magnetization direction of the capping layer to align approximately with the second direction to cause the polarization of the polarized spin wave to be rotated in a second rotation direction. The second rotation direction is opposite to the first rotation direction.

Also in accordance with the disclosure, there is provided a computing device including a logic track, an input track arranged crossing the logic track at a first position of the logic track, and an output track arranged crossing the logic track at a second position of the logic track near a logic-track domain wall. The logic track includes two logic-track magnetic domains separated by the logic-track domain wall. The input track includes at least one input-track magnetic domain, and each of the at least one input-track magnetic domain includes at least one input-track storage unit configured to store binary 0 or 1. The output track includes at least one output-track magnetic domain, and each of the at least one output-track magnetic domain includes at least one output-track storage unit configured to store binary 0 or 1.

In some embodiments, the logic track includes a first magnetic layer and a second magnetic layer arranged above the first magnetic layer. The first magnetic layer includes a first magnetic section in a first one of the two logic-track magnetic domains and a second magnetic section in a second one of the two logic-track magnetic domains. A magnetization of the first magnetic section points in a first direction and a magnetization of the second magnetic section points in a second direction approximately opposite to the first direction. The second magnetic layer and includes a third magnetic section in the first one of the two logic-track magnetic domains and a fourth magnetic section in the second one of the two logic-track magnetic domains. A magnetization of the third magnetic section points in the second direction and a magnetization of the fourth magnetic section points in the first direction.

In some embodiments, a magnetization of each of the at least one input-track magnetic domain points approximately in the first direction or approximately in the second direction.

In some embodiments, the first direction and the second direction are approximately perpendicular to an upper surface of the logic track.

In some embodiments, the first direction and the second direction are approximately perpendicular to a side surface of the logic track.

In some embodiments, the first magnetic layer and the second magnetic layer have a same width.

In some embodiments, a position of the logic-track domain wall is located at an interface between the two logic-track magnetic domains.

In some embodiments, the input track and the output track are approximately perpendicular to the logic track.

In some embodiments, the computing device further includes an input-track driving device coupled to the input track and an output-track driving device coupled to the output track. The input-track driving device is configured to drive one of the at least one input-track storage unit into and out of an overlapping section of the input track. The overlapping section of the input track is a section of the input track that overlaps the logic track. The output-track driving device is configured to drive one of the at least one output-track storage unit out of an overlapping section of the output track. The overlapping section of the output track is a section of the output track that overlaps the logic track.

In some embodiments, the first position is closer to a spin wave injecting end of the logic track than the second position.

In some embodiments, the computing device further includes an instruction track arranged crossing the logic track. The instruction track is configured to change a polarization direction of a spin wave injected from the spin wave injecting end.

In some embodiments, the instruction track is arranged approximately perpendicular to the logic track.

In some embodiments, the instruction track is a first instruction track. The computing device further includes a second instruction track arranged crossing the logic track.

In some embodiments, each of the first instruction track and the second instruction track includes a plurality of magnetic domains. A magnetization of each of the plurality of magnetic domains points in a first direction or in a second direction approximately opposite to the first direction. A combination of the magnetization of one of the magnetic domains of the first instruction track that overlaps the logic track and the magnetization of one of the magnetic domains of the second instruction track that overlaps the logic track determines a rotation angle of the polarization direction of the spin wave.

In some embodiments, the first instruction track and the second instruction track are arranged approximately perpendicular to the logic track.

In some embodiments, the input track is a first input track, the at least one input-track magnetic domain is at least one first input-track magnetic domain, and the at least one input-track storage unit is at least one first input-track storage unit, and the output track is a first output track, the at least one output-track magnetic domain is at least one first output-track magnetic domain, and the at least one output-track storage unit is at least one first output-track storage unit. The computing device further includes a second input track arranged crossing the logic track at a third position of the logic track, and a second output track arranged crossing the logic track at a position of the logic track that corresponds to the second position of the logic track and is near the logic-track domain wall. The second input track includes at least one second input-track magnetic domain and each of the at least one second input-track magnetic domain includes at least one second input-track storage unit configured to store binary 0 or 1. The second output track includes at least one second output-track magnetic domain, and each of the at least one second output-track magnetic domain includes at least one second output-track storage unit configured to store binary 0 or 1.

In some embodiments, the first input track and the second input track are arranged approximately parallel to each other and approximately perpendicular to the logic track. The first output track and the second output track are arranged on opposite sides of the logic track and approximately parallel to each other, and approximately perpendicular to the logic track.

Also in accordance with the disclosure, there is provided a processing device including a forward logic track (FLT), a backward logic track (BLT), and a data track arranged crossing the FLT and the BLT. The FLT includes two FLT magnetic domains separated by a FLT domain wall. The BLT includes two BLT magnetic domains separated by a BLT domain wall. The data track includes at least one input storage unit arranged corresponding to the FLT and at least one output storage unit arranged corresponding to the BLT. Each of the at least one input storage unit is configured to store binary 0 or 1, and each of the at least one output storage unit is configured to store binary 0 or 1.

In some embodiments, the FLT and the BLT are approximately parallel to each other.

In some embodiments, the data track is approximately perpendicular to the FLT and to the BLT.

In some embodiments, a magnetization of each of the at least one input storage unit points approximately in a first direction or approximately in a second direction. The first direction and the second direction are opposite to each other.

In some embodiments, the processing device further includes a data-track driving device coupled to the data track. The data-track driving device is configured to drive one of the at least one input-track storage unit into and out of a forward overlapping section of the data track or drive one of the at least one output-track storage unit into and out of a backward overlapping section of the data track. The forward overlapping section of the data track is a section of the data track that overlaps the FLT, and the backward overlapping section of the data track is a section of the data track that overlaps the BLT.

In some embodiments, the processing device further includes a forward instruction track arranged crossing the FLT and a backward instruction track arranged crossing the BLT. The forward instruction track is configured to set a function of the FLT by changing a polarization direction of a forward spin wave injected from the forward spin wave injecting end. The backward instruction track is configured to set a function of the BLT by changing a polarization direction of a backward spin wave injected from the backward spin wave injecting end.

In some embodiments, the forward instruction track is a first forward instruction track and the backward instruction track is a first backward instruction track. The computing device further includes a second forward instruction track arranged crossing the FLT and a second backward instruction track arranged crossing the BLT. The second forward instruction track is configured to further change the polarization direction of the forward spin wave and the second backward instruction track is configured to further change the polarization direction of the backward spin wave.

In some embodiments, the processing device further includes a register track arranged crossing the FLT and the BLT. The register track includes a forward overlapping section that overlaps the FLT at a position farther away from a forward spin wave injecting end of the FLT and a backward overlapping section that overlaps the BLT at a position farther away from a backward spin wave injecting end of the BLT. The register track further includes at least one register storage unit configured to store information carried by a forward spin wave in the FLT.

In some embodiments, the processing device further includes a register-track driving device coupled to the register track. The register-track driving device is configured to shift the at least one register storage unit from the forward overlapping section to the backward overlapping section.

In some embodiments, the FLT is an upper FLT, the two FLT magnetic domains are two upper FLT magnetic domains, and the FLT domain wall is an upper FLT domain wall; and the BLT is an upper BLT, the two BLT magnetic domains are two upper BLT magnetic domains, and the BLT domain wall is an upper BLT domain wall. The processing device further includes a lower FLT arranged approximately parallel to and below the upper FLT and a lower BLT arranged approximately parallel to and below the upper BLT. The lower FLT includes two lower FLT magnetic domains separated by a lower FLT domain wall, and the upper FLT and the lower FLT forming a FLT pair. The lower BLT includes two lower BLT magnetic domains separated by a lower BLT domain wall, and the upper BLT and the lower BLT forming a BLT pair.

In some embodiments, the FLT pair is a first FLT pair, the upper FLT is a first upper FLT, and the lower FLT is a first lower FLT, and the BLT pair is a first BLT pair, the upper BLT is a first upper BLT, and the lower BLT is a first lower BLT. The processing device further includes a second FLT pair arranged adjacent to the first FLT pair and including a second upper FLT and a second lower FLT below the second upper FLT, and a second BLT pair arranged adjacent to the first BLT pair and including a second upper BLT and a second lower BLT below the second upper BLT.

In some embodiments, the first FLT pair and the second FLT pair are approximately parallel to each other and the first BLT pair and the second BLT pair are approximately parallel to each other.

In some embodiments, the processing device further includes a third FLT pair arranged adjacent to the second FLT pair and including a third upper FLT and a third lower FLT below the third FLT, a fourth FLT pair arranged adjacent to the third FLT pair and including a fourth upper FLT and a fourth lower FLT below the fourth FLT, a third BLT pair arranged adjacent to the second BLT pair and including a third upper BLT and a third lower BLT below the third upper BLT, and a fourth BLT pair arranged adjacent to the third BLT pair and including a fourth upper BLT and a fourth lower BLT below the fourth upper BLT. The first FLT pair, the second FLT pair, the third FLT pair, and the fourth FLT pair form an FLT group. The first upper FLT, the second upper FLT, the third upper FLT, and the fourth upper FLT form an upper FLT layer. The first lower FLT, the second lower FLT, the third lower FLT, and the fourth lower FLT form a lower FLT layer. The first BLT pair, the second BLT pair, the third BLT pair, and the fourth BLT pair form a BLT group. The first upper BLT, the second upper BLT, the third upper BLT, and the fourth upper BLT form an upper BLT layer. The first lower BLT, the second lower BLT, the third lower BLT, and the fourth lower BLT form a lower BLT layer.

In some embodiments, the first FLT pair, the second FLT pair, the third FLT pair, and the fourth FLT pair are approximately parallel to each other, and the first BLT pair, the second BLT pair, the third BLT pair, and the fourth BLT pair are approximately parallel to each other.

In some embodiments, the data track is a first data track, the at least one input storage unit is at least one first input storage unit, and the at least one output storage unit is at least one first output storage unit. The processing device further includes a second data track arranged crossing the FLT group. The second data track includes at least one second input storage unit arranged corresponding to the FLT group and at least one second output storage unit arranged corresponding to the BLT group. Each of the at least one second input storage unit is configured to store binary 0 or 1, and each of the at least one second output storage unit is configured to store binary 0 or 1. The first data track and the second data track form a data track pair.

In some embodiments, the first data track and the second data track are approximately parallel to each other.

In some embodiments, the first data track and the second data track are at least partially sandwiched between the upper FLT layer and the lower FLT layer.

In some embodiments, the processing device further includes a first upper forward instruction track arranged crossing the FLT group, a second upper forward instruction track arranged crossing the FLT group, a first lower forward instruction track arranged crossing the FLT group at a position below the first upper forward instruction track, and a second lower forward instruction track arranged crossing the FLT group at a position below the second upper forward instruction track. The first upper forward instruction track is configured to change a polarization direction of an upper forward spin wave in the upper FLT layer. The second upper forward instruction track is configured to further change the polarization direction of the upper forward spin wave. The first lower forward instruction track is configured to change a polarization direction of a lower forward spin wave in the lower FLT layer. The second lower forward instruction track is configured to further change the polarization direction of the lower forward spin wave.

In some embodiments, the first upper forward instruction track and the second upper forward instruction track are arranged above the upper FLT layer, and the first lower forward instruction track and the second lower forward instruction track are arranged below the lower FLT layer and approximately parallel to the first upper forward instruction track and the second upper forward instruction track, respectively.

In some embodiments, the first upper forward instruction track, the first lower forward instruction track, the second upper forward instruction track, and the second lower forward instruction track are at least partially sandwich the upper FLT layer and the lower FLT layer.

In some embodiments, the processing device further includes a first upper backward instruction track arranged crossing the BLT group, a second upper backward instruction track arranged crossing the BLT group, a third upper backward instruction track arranged crossing the BLT group, a first lower backward instruction track arranged crossing the BLT group, a second lower backward instruction track arranged crossing the BLT group, and a third lower backward instruction track arranged crossing the BLT group. The first upper backward instruction track is configured to change a polarization direction of an upper backward spin wave in the upper BLT layer. The second upper backward instruction track is configured to further change the polarization direction of the upper backward spin wave. The third upper backward instruction track is configured to further change the polarization direction of the upper backward spin wave. The first lower backward instruction track is configured to change a polarization direction of a lower backward spin wave in the lower BLT layer. The second lower backward instruction track is configured to further change the polarization direction of the lower backward spin wave. The third lower backward instruction track is configured to further change the polarization direction of the lower backward spin wave.

In some embodiments, the first upper backward instruction track, the second upper backward instruction track, and the third upper backward instruction track are arranged above the upper BLT layer. The first lower backward instruction track, the second lower backward instruction track, and the third lower backward instruction track are arranged below the lower BLT layer and approximately parallel to the first upper backward instruction track, the second upper backward instruction track, and the third upper backward instruction track, respectively.

In some embodiments, the first upper backward instruction track, the first lower backward instruction track, the second upper backward instruction track, the second lower backward instruction track, the third upper backward instruction track, and the third lower backward instruction track at least partially sandwich the upper BLT layer and the lower BLT layer.

In some embodiments, the processing device further includes an upper register track arranged crossing the FLT group and the BLT group, and a lower register track arranged crossing the FLT group and the BLT group and below the upper register track. The upper register track includes an upper forward overlapping section that overlaps the FLT group at a position farther away from a forward spin wave injecting end of the FLT group and an upper backward overlapping section that overlaps the BLT group at a position farther away from a backward spin wave injecting end of the BLT group. The upper register track further includes at least one upper register storage unit configured to store information carried by an upper forward spin wave in the upper FLT layer. The lower register track includes a lower forward overlapping section that overlaps the FLT group at a position farther away from the forward spin wave injecting end and lower backward overlapping section that overlaps the BLT group at a position farther away from the backward spin wave injecting end. The lower register track further includes at least one lower register storage unit configured to store information carried by a lower forward spin wave in the lower FLT layer.

In some embodiments, the upper register track is arranged above the FLT group and the BLT group and the lower register track is arranged below the FLT group and the BLT group.

In some embodiments, the upper register track and the lower register track at least partially sandwich the upper FLT layer, the lower FLT layer, the upper BLT layer, and the lower BLT layer.

Also in accordance with the disclosure, there is provided a method for logic computing including shifting at least one input-track storage unit of an input track into a section of the input track that overlaps a logic track, and injecting a polarized spin wave into the logic track. The polarized spin wave is modulated by the at least one input-track storage unit to carry the information.

In some embodiments, the method for logic computing further includes modulating a polarization direction of the spin wave by shifting at least one instruction storage unit of an instruction track into a section of the instruction track that overlaps the logic track.

In some embodiments, the method for logic computing further includes shifting at least one output-track storage unit out of a section of an output track that overlaps the logic track.

In some embodiments, the logic track includes two logic-track magnetic domains separated by the logic-track domain wall.

In some embodiments, the logic track includes a first magnetic layer and a second magnetic layer arranged above the first magnetic layer. The first magnetic layer includes a first magnetic section in a first one of the two logic-track magnetic domains and a second magnetic section in a second one of the two logic-track magnetic domains. A magnetization of the first magnetic section points in a first direction and a magnetization of the second magnetic section points in a second direction approximately opposite to the first direction. The second magnetic layer and includes a third magnetic section in the first one of the two logic-track magnetic domains and a fourth magnetic section in the second one of the two logic-track magnetic domains. A magnetization of the third magnetic section points in the second direction and a magnetization of the fourth magnetic section points in the first direction.

Also in accordance with the disclosure, there is provided another method for logic computing including shifting a plurality of input storage units of a plurality of data tracks into a plurality of sections of the plurality of data tracks that overlap a plurality of forward logic tracks (FLTs), injecting a plurality of forward polarized spin waves into the plurality of FLTs, shifting a plurality of register storage units of a register track from a plurality of sections of the register track that overlap the plurality of FLTs into a plurality of sections of the register track that overlap a plurality of backward logic tracks (BLTs), and injecting a plurality of backward polarized spin waves into the plurality of BLTs. The plurality of forward polarized spin waves are modulated by the plurality of input storage units to carry information and the plurality of backward polarized spin waves are modulated by the plurality of register storage units to carry information.

In some embodiments, the method for logic computing further includes shifting a plurality of output storage units of the data tracks out of a plurality of sections of the data tracks that overlap the plurality of BLTs.

DETAILED DESCRIPTION OF THE EMBODIMENTS

Hereinafter, embodiments consistent with the disclosure will be described with reference to the drawings, which are merely examples for illustrative purposes and are not intended to limit the scope of the disclosure. Wherever possible, the same reference numbers will be used throughout the drawings to refer to the same or similar parts.

Figure 1:
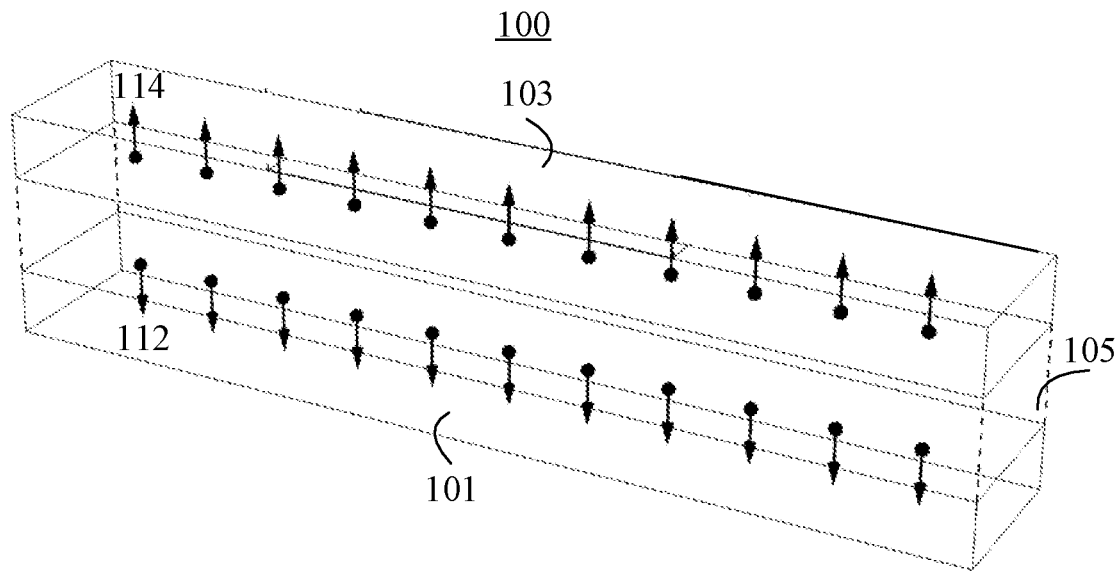
FIG. 1 is a schematic diagram showing a synthetic antiferromagnet (SyAF) according to an embodiment of the disclosure.

FIG. 1 is a schematic diagram of a synthetic antiferromagnet (SyAF) 100 consistent with the disclosure. As shown in FIG. 1, the SyAF 100 includes a first magnetic layer 101, and a second magnetic layer 103 arranged above the first magnetic layer 101. In some embodiments, the first magnetic layer 101 and the second magnetic layer 103 can include ferromagnetic layers. The first magnetic layer 101 has a magnetization pointing in a first direction 112 and the second magnetic layer 103 has a magnetization pointing in a second direction 114. The second direction 114 is approximately opposite to the first direction 112. In some embodiments, the first direction 112 and the second direction 114 can be approximately perpendicular to an upper surface of the second magnetic layer 103. For example, as shown in FIG. 1, the magnetization of the second magnetic layer 103 points in an upward direction which is perpendicular to the upper surface of the second magnetic layer 103. The magnetization of the first magnetic layer 101 points in a downward direction which is opposite to a magnetization direction of the second magnetic layer 103. In some other embodiments, the first direction 112 and the second direction 114 can be approximately parallel to the upper surface of the second magnetic layer 103 or approximately perpendicular to a side surface of the second magnetic layer 103.

In some embodiments, the first magnetic layer 101 and the second magnetic layer 103 may have an approximately same width. In some embodiments, the first magnetic layer 101 and the second magnetic layer 103 can include a same material or a same structure. That is, other than the magnetization direction, the first magnetic layer 101 and the second magnetic layer 103 may be the same as each other in terms of material properties such as material compositions, or structure properties such as films making up these two layers. In some embodiments, a saturation magnetization of the first magnetic layer 101 can be same as a saturation magnetization of the second magnetic layer 103. In some embodiments, each of the first magnetic layer 101 and the second magnetic layer 103 can include a magnetic metal material, e.g., iron (Fe), nickel (Ni), cobalt (Co), chromium (Cr), or the like. In some other embodiments, each of the first magnetic layer 101 and the second magnetic layer 103 can include an insulator material, e.g., yttrium iron garnet (YIG) or the like.

In some embodiments, the SyAF 100 further includes a spacer layer 105 sandwiched between the first magnetic layer 101 and the second magnetic layer 103. In some embodiments, the spacer layer 105 can be a metallic spacer layer. In some embodiments, the first magnetic layer 101 and the second magnetic layer 103 can be coupled antiferromagnetically through the Rudderman-Kittel-Kasuya-Yosida (RKKY) interaction across the spacer layer 105. Because the first magnetic layer 101 and the second magnetic layer 103 are spatially separated by the spacer layer 105, the left-circularly polarized spin waves and the right-circularly polarized spin waves can be separated in the first magnetic layer 101 and the second magnetic layer 103 of the SyAF 100. For example, the left-circularly polarized spin waves are mainly localized in the first magnetic layer 101 that has the magnetization pointing in the downward direction and the right-circularly polarized spin wave are mainly localized in the second magnetic layer 103 that has the magnetization pointing in the upward direction.

Figure 2:
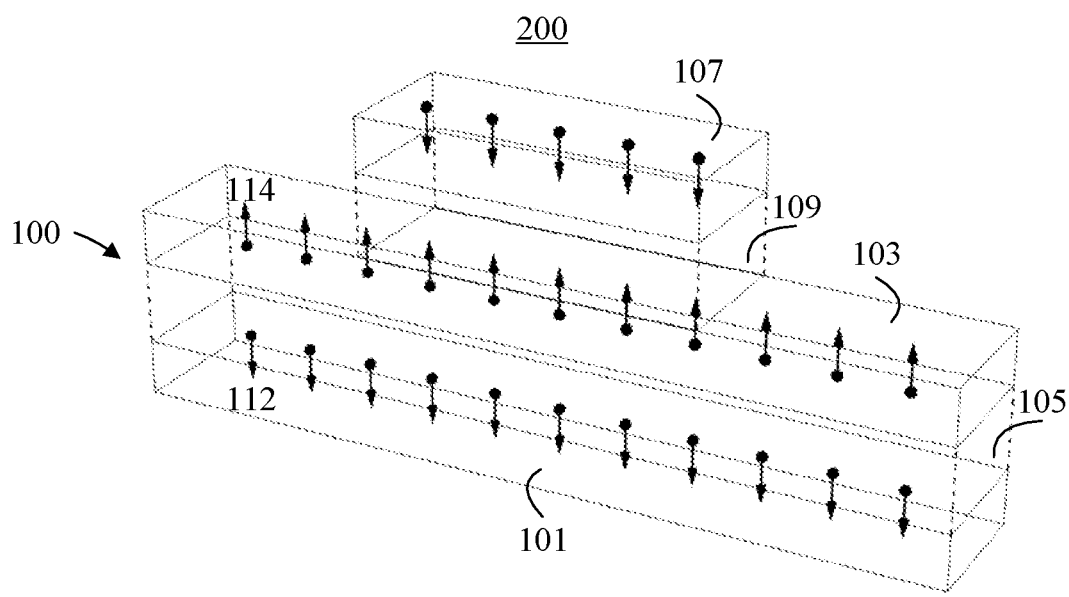
FIG. 2 is a schematic diagram of a spin wave control device according to an embodiment of the disclosure.

FIG. 2 is a schematic diagram of a spin wave control device 200 consistent with the disclosure. The spin wave control device 200 can be used to control a polarization direction of a polarized spin wave injected into the spin wave control device 200.

As shown in FIG. 2, the spin wave control device 200 includes the SyAF 100 and a capping layer 107 coupled to the SyAF 100 and overlapping a portion of the SyAF 100. The capping layer 107 can be, for example, a magnetic layer. In some embodiments, the capping layer 107 is arranged above the second magnetic layer 103 and overlaps a portion of the second magnetic layer 103. In some other embodiments, the capping layer 107 can be arranged below the first magnetic layer 101 and overlaps a portion of the first magnetic layer 101.

In some embodiments, the spacer layer 105 is a first spacer layer 105 and the spin wave control device 200 further includes a second spacer layer 109 sandwiched between the SyAF 100 and the capping layer 107. In the example shown in FIG. 2, the capping layer 107 is arranged above the second magnetic layer 103, and the second spacer layer 109 is sandwiched between the second magnetic layer 103 and the capping layer 107. A coupling strength between the second magnetic layer 103 and the capping layer 107 depends on a thickness of the second spacer layer 109. In the example in which the capping layer 107 is arranged below the first magnetic layer 101, the second spacer layer 109 can be sandwiched between the first magnetic layer 101 and the capping layer 107, and the coupling strength between the first magnetic layer 101 and the capping layer 107 depends on the thickness of the second spacer layer 109. In some embodiments, the second spacer layer 109 can be a metallic spacer layer.

In some embodiments, the second magnetic layer 103 and the first magnetic layer 101 can have an approximately same width. In some embodiments, a length of the capping layer 107 can be less than lengths of the second magnetic layer 103 and the first magnetic layer 101. A length direction of the capping layer 107 or a length direction of either of the first magnetic layer 101 or the second magnetic layer 103 refers to a propagation direction of the polarized spin wave in the spin wave control device 200.

The capping layer 107 has a magnetization pointing approximately in the first direction 112 or approximately in the second direction 114. For example, as shown in FIG. 2, a magnetization direction of the capping layer 107 can be aligned with a magnetization direction of the first magnetic layer 101, e.g., pointing in the downward direction, or can be aligned with the magnetization direction of the second magnetic layer 103, e.g., pointing in the upward direction.

In some embodiments, the magnetization direction of the capping layer 107 can be controlled to switch between aligning approximately with the first direction 112 and aligning approximately with the second direction 114. In some embodiments, the spin wave control device 200 can further include a switching device (not shown in FIG. 2) coupled to the capping layer 107. The switching device can be configured to switch the direction of the magnetization of the capping layer 107. For example, the switching device can switch the direction of the magnetization of the capping layer 107 via current-driven domain wall motion.

The spin wave control device 200 is configured to rotate a polarization of the polarized spin wave (not shown in FIG. 2) injected into the spin wave control device 200. The polarized spin wave can include a linearly polarized spin wave. A rotation direction of the polarization of the polarized spin wave depends on the magnetization direction of the capping layer 107, the magnetization direction of the first magnetic layer 101, and the magnetization direction of the second magnetic layer 103. For example, as shown in FIG. 2, when the magnetization direction of the capping layer 107 is approximately aligned with the magnetization direction of the first magnetic layer 101 that points in the downward direction, the polarization of the polarized spin wave is rotated clockwise. As another example, when the magnetization direction of the capping layer 107 is approximately parallel with the magnetization direction of the second magnetic layer 101 that points in the upward direction, the polarization of the polarized spin wave can be rotated counter-clockwise. A rotation angle of the polarization of the polarized spin wave may depend on the length of the capping layer, the thickness of the first spacer layer, the thickness of the second spacer layer, a frequency of the polarized spin wave, material properties of the first magnetic layer and the second magnetic layer, and/or the like.

Consistent with embodiments of the disclosure, the spin wave control device can be realized by coupling the capping layer to the SyAF. The capping layer antiferromagnetically coupled to the first magnetic layer or the second magnetic layer can cause an extra phase for the polarized spin wave in the first magnetic layer or the second magnetic layer, such that the polarized spin wave passing by the capping layer can develop a relative phase delay, resulting in a rotation of the polarization of the polarized spin wave that is injected into the SyAF. Therefore, the polarization direction of the polarized spin wave can be controlled by the spin wave control device.

Figure 3:
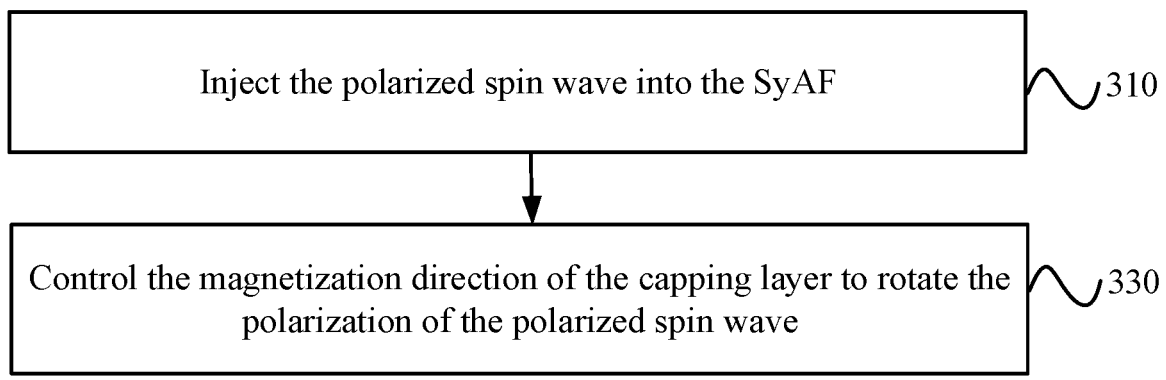
FIG. 3 is a flow chart of a method for controlling a polarized spin wave according to an embodiment of the disclosure.

FIG. 3 is a flow chart of a method 300 for controlling a polarized spin wave 300 consistent with the disclosure.

As shown in FIG. 3, at 310, the polarized spin wave is injected into the SyAF.

The polarized spin wave can be injected into the SyAF from an end of the SyAF, and such an end is also referred to as a "spin wave injecting end" of the SyAF. The polarized spin wave can include the linearly polarized spin wave having a polarization angle. The SyAF includes the first magnetic layer and the second magnetic layer arranged above the first magnetic layer. The first magnetic layer has the magnetization pointing in the first direction and the second magnetic layer has the magnetization pointing in the second direction that is approximately opposite to the first direction. In some embodiments, the first direction and the second direction can be approximately perpendicular to the upper surface of the second magnetic layer. In some other embodiments, the first direction and the second direction can be approximately parallel to the upper surface of the second magnetic layer or approximately perpendicular to the side surface of the second magnetic layer. The SyAF is similar to the SyAF 100 in FIG. 1, and the detailed description thereof is omitted here.

At 330, the magnetization direction of the capping layer is controlled to rotate the polarization of the polarized spin wave.

The capping layer is coupled to the SyAF and overlaps a portion of the SyAF. In some embodiments, the capping layer can be arranged above the second magnetic layer of the SyAF and can overlap a portion of the second magnetic layer of the SyAF. In some other embodiments, the capping layer can be arranged below the first magnetic layer of the SyAF and can overlap a portion of the first magnetic layer of the SyAF.

In some embodiments, the magnetization direction of the capping layer can be controlled to align approximately with the first direction to cause the polarization of the polarized spin wave to be rotated (retarded) in a first rotation direction. For example, when the magnetization direction of the capping layer is approximately aligned with the first direction and the first direction is the downward direction, the polarization of the polarized spin wave can be right retarded, i.e., rotated clockwise. As another example, when the magnetization direction of the capping layer is approximately aligned with the first direction and the first direction is the upward direction, the polarization of the polarized spin wave can be left retarded, i.e., rotated counter-clockwise.

In some other embodiments, the magnetization direction of the capping layer can be controlled to align approximately with the second direction to cause the polarization of the polarized spin wave to be rotated (retarded) in a second rotation direction. The second rotation direction is opposite to the first rotation direction. For example, when the magnetization direction of the capping layer is approximately aligned with the second direction and the second direction is the upward direction, the polarization of the polarized spin wave can be left retarded, i.e., rotated counter-clockwise. As another example, when the magnetization direction of the capping layer is approximately aligned with the second direction and the second direction is the downward direction, the polarization of the polarized spin wave can be right retarded, i.e., rotated clockwise.

The rotation angle of the polarization of the polarized spin wave depends on the length of the capping layer, the thickness of the first metallic spacer layer, the thickness of the second metallic spacer layer, the frequency of the polarized spin wave, the material properties of the first magnetic layer and the second magnetic layer, and/or the like. The first spacer layer and the second spacer layer are similar to the first spacer layer 105 and the second spacer layer 109 in FIG. 2, respectively, and the detailed description thereof is omitted here.

Figure 4A:
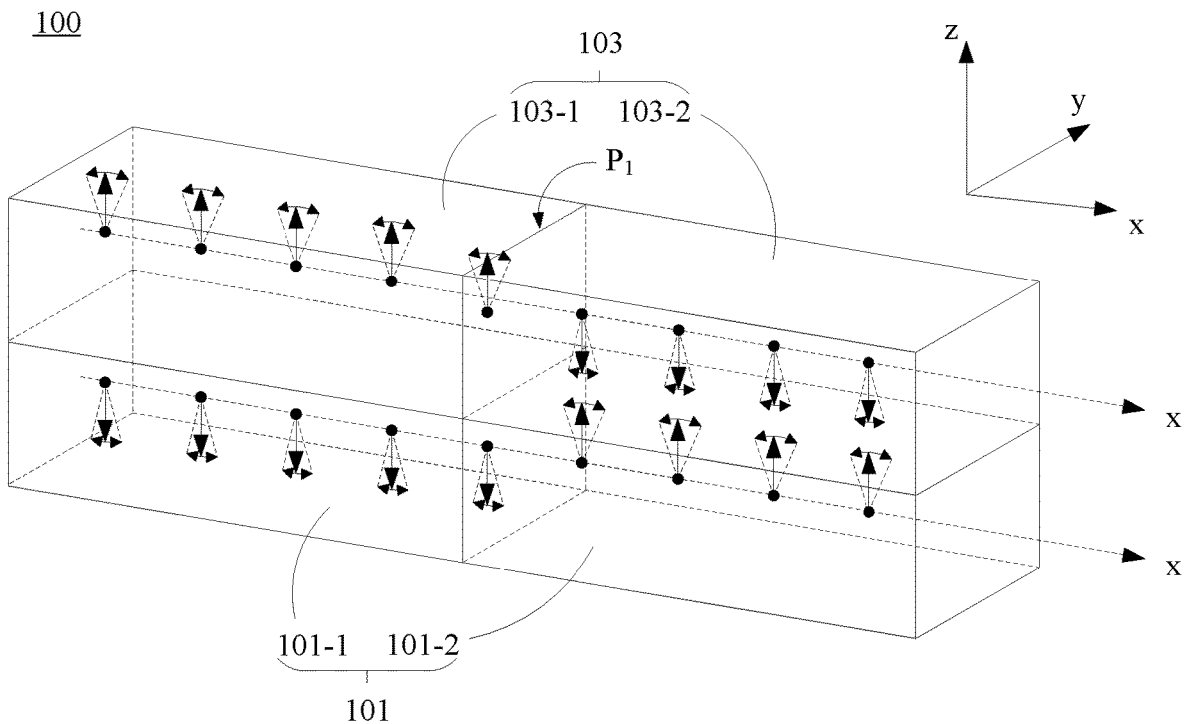
FIGS. 4A and 4B schematically show driving a domain wall by a polarized spin wave according to an embodiment of the disclosure.
Figure 4B:
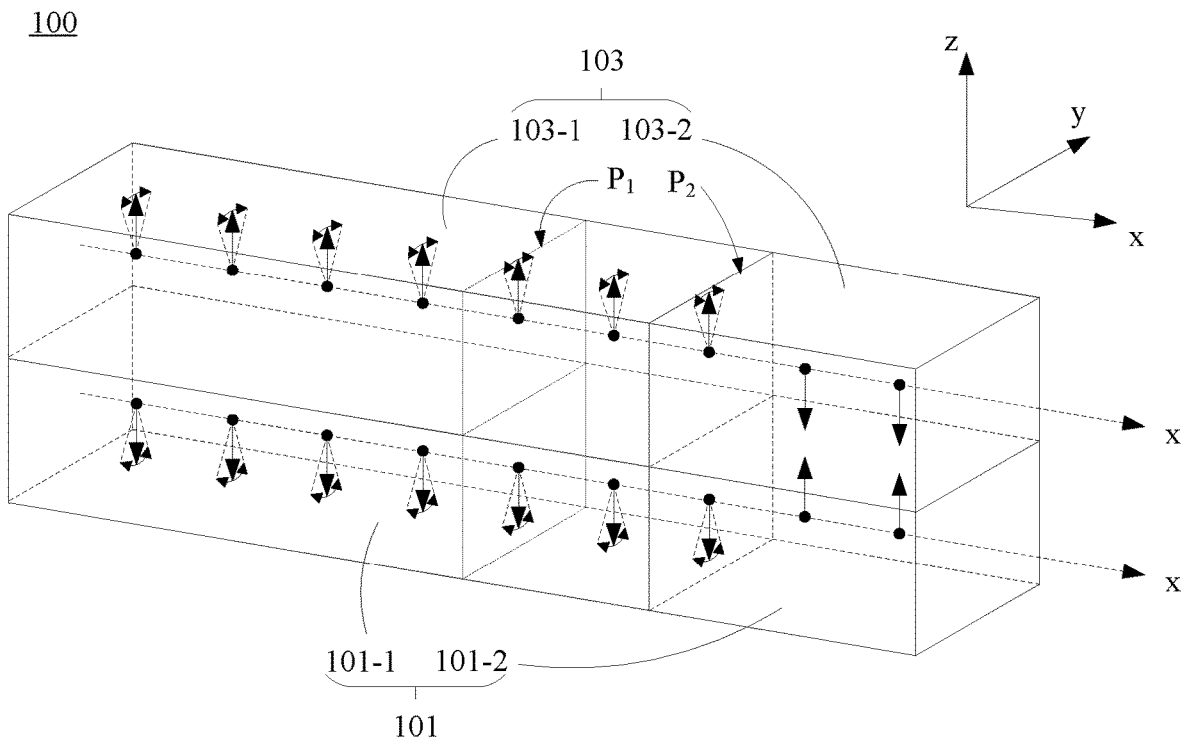

FIGS. 4A and 4B schematically show driving a domain wall by the polarized spin wave consistent with the disclosure. As shown in FIGS. 4A and 4B, the SyAF 100 includes two magnetic domains separated by a domain wall. The first magnetic layer 101 includes a first magnetic section 101-1 in a first one of the two magnetic domains and a second magnetic section 101-2 in a second one of the two magnetic domains. A magnetization direction of the first magnetic section 101-1 is approximately opposite to a magnetization direction of the second magnetic section 101-2. For example, the magnetization of the first magnetic section 101-1 points in the first direction, e.g., the downward direction, and the magnetization of the second magnetic section 101-2 points in the second direction, e.g., the upward direction. The second magnetic layer 103 includes a third magnetic section 103-1 in the first one of the two magnetic domains and a fourth magnetic section 103-2 in the second one of the two magnetic domains. A magnetization direction of the third magnetic section 103-1 is approximately opposite to a magnetization direction of the fourth magnetic section 103-2. For example, the magnetization of the third magnetic section 103-1 points in the second direction, e.g., the upward direction, and the magnetization of the fourth magnetic section points in the first direction, e.g., the downward direction. In some embodiments, the first magnetic section 101-1, the second magnetic section 101-2, the third magnetic section 103-1, and the fourth magnetic section 103-2 can include ferromagnetic sections.

As shown in FIGS. 4A and 4B, the third magnetic section 103-1 is arranged above the first magnetic section 101-1 and the fourth magnetic section 103-2 is arranged above the second magnetic section 101-2. The first magnetic section 101-1 and the third magnetic section 103-1 correspond to the first one of the two magnetic domains, and the second magnetic section 101-2 and the fourth magnetic section 103-2 correspond to the second one of the two magnetic domains. An interface between the first magnetic section 101-1 and the second magnetic section 101-2 and an interface between the third magnetic section 103-1 and the fourth magnetic section 103-2 are aligned with each other and form an interface between the first one of the two magnetic domains and the second one of the two magnetic domains.

The domain wall is located at the interface between the first one of the two magnetic domains and the second one of the two magnetic domains, e.g., at position $P_1$ shown in FIGS. 4A and 4B. Because of the Dzyaloshinskii-Moriya interaction (DMI), the domain wall can be configured to work as a spin wave polarizer that can transmit spin waves linearly-polarized in a certain direction and block spin waves linearly-polarized in a direction perpendicular to the certain direction. The blocked spin waves can be reflected by the domain wall, and can exert force on the domain wall and cause the domain wall to move forward. For example, as shown in FIGS. 4A and 4B, when the first direction is the downward direction and the second direction is the upward direction, X-polarized spin waves can be transmitted through the domain wall and Y-polarized spin waves can be blocked by the domain wall. In this scenario, the X-polarized spin waves have no effect on the domain wall and hence the domain wall can remain at position $P_1$, as shown in FIG. 4A. In contrast, the reflected Y-polarized spin waves can exert force on the domain wall and push the domain wall to move forward to a new position $P_2$, as shown in FIG. 4B. The X-polarized spin waves refer to the spin waves linearly-polarized in an X direction (e.g., a longitudinal direction) and the Y-polarized spin waves refer to the spin waves linearly-polarized in a Y direction (e.g., a transverse direction).

Therefore, the domain wall can be controlled to move by injecting the spin wave linearly-polarized in a direction that is blocked by the domain wall.

Hereinafter, a computing device based on the polarization direction control of the polarized spin wave and using the polarized spin wave to drive the domain wall motion will be described in detail.

Figure 5:
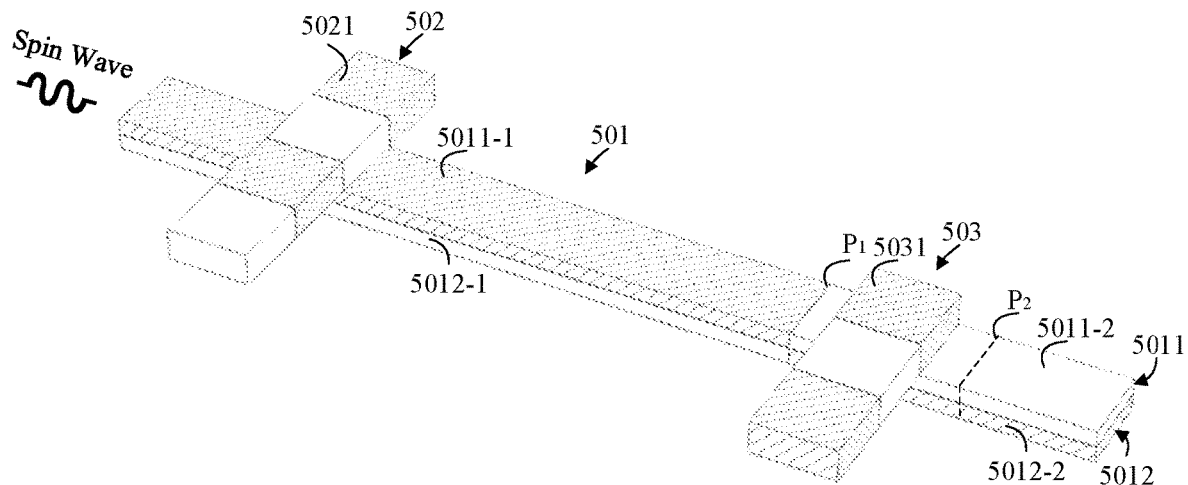
FIG. 5 is a schematic diagram of a computing device according to an embodiment of the disclosure.

FIG. 5 is a schematic diagram of a computing device 500 consistent with the disclosure. The computing device 500 can be used to read and write information by encoding the information in a polarization angle of the polarized spin wave.

As shown in FIG. 5, the computing device 500 includes a logic track 501, an input track 502, and an output track 503. The logic track 501 includes two logic-track magnetic domains separated by a logic-track domain wall. A position of the logic-track domain wall is located at an interface between the two logic-track magnetic domains. The input track 502 is arranged crossing the logic track 501 at a first position of the logic track 501 and the output track 503 is arranged crossing the logic track 501 at a second position of the logic track 501 near the logic-track domain wall. The first position is closer to a spin wave injecting end of the logic track 501 than the second position. In some embodiments, the first position can be located at a first one of the two logic-track magnetic domains and the second position can be located at a second one of the two logic-track magnetic domains. In some embodiments, the input track 502 and the output track 503 can be approximately perpendicular to the logic track 501. In some embodiments, the input track 502 and the output track 503 can be arranged above the logic track 501 or can be arranged below the logic track 501.

The logic track 501 includes a first magnetic layer 5011 and a second magnetic layer 5012 arranged above the first magnetic layer 5011. In some embodiments, the first magnetic layer 5011 and the second magnetic layer 5012 can have a same width. In some embodiments, the first magnetic layer 5011 and the second magnetic layer 5012 can include the ferromagnetic layers. The first magnetic layer 5011 includes a first magnetic section 5011-1 in the first one of the two logic-track magnetic domains and a second magnetic section 5011-2 in the second one of the two logic-track magnetic domains. A magnetization direction of the first magnetic section 5011-1 points in the first direction and a magnetization direction of the second magnetic section 5011-2 points in the second direction. The second magnetic layer 5012 includes a third magnetic section 5012-1 in the first one of the two logic-track magnetic domains and a fourth magnetic section 5012-2 in the second one of the two logic-track magnetic domains. A magnetization direction of the third magnetic section points in the second direction and a magnetization direction of the fourth magnetic section points in the first direction. In some embodiments, the first direction can be opposite to the second direction. In some embodiments, the first direction and the second direction can be approximately perpendicular to an upper surface of the logic track 501. For example, as shown in FIG. 5, the first direction is the downward direction and the second direction is the upward direction. In some other embodiments, the first direction and the second direction can be approximately parallel to the upper surface of the logic track 501 or perpendicular to a side surface of the logic track 501. In some embodiments, the first magnetic section 5011-1, the second magnetic section 5011-2, the third magnetic section 5012-1, and the fourth magnetic section 5012-2 can include the ferromagnetic sections.

As shown in FIG. 5, the input track 502 includes at least one input-track magnetic domain 5021. Each of the at least one input-track magnetic domain 5021 can include at least one input-track storage unit. The at least one input-track storage unit can be configured to store binary 0 or 1. Binary 0 or 1 can correspond to a magnetization direction of the at least one input-track magnetic domain 5021 and hence of the at least one input-track storage unit. In some embodiments, the magnetization of each of the at least one input-track magnetic domain 5021 can point approximately in the first direction or approximately in the second direction. For example, if the magnetization of an input-track magnetic domain 5021 points in approximately the first direction and the first direction is the downward direction, then the at least one input-track storage unit of the input-track magnetic domain 5021 stores binary 0; and if the magnetization direction of an input-track magnetic domain 5021 points in approximately the second direction and the second direction is the upward direction, then the at least one input-track storage unit of the input-track magnetic domain 5021 stores binary 1.

In some embodiments, the computing device 500 further includes an input-track driving device (not shown in FIG. 5) coupled to the input track 502. The input-track driving device can be configured to drive one of at least one input-track storage unit into and out of an overlapping section of the input track 502, e.g., via current-driven domain wall motion. The overlapping section of the input track 502 refers to a section of the input track 502 that overlaps the logic track 501. In some embodiments, the input-track driving device can be configured to provide a clocked electric current to drive one of at least one input-track storage unit into and out of the overlapping section of the input track 502 via current-driven domain wall motion. The clocked electric current refers to an electric current that is provided at a certain frequency.

Consistent with embodiments of the disclosure, the input track 502 and the first one of the two logic-track magnetic domains in the logic track 501 can be used as a spin wave control device that is similar to the spin wave control device 200 in FIG. 2. The polarized spin wave can be injected into the logic track 501 from the spin wave injecting end of the logic track 501. As the polarized spin wave passing by the overlapping section of the input track 502, the polarization of the polarized spin wave can be rotated, according to at least the magnetization direction of the overlapping section of the input track 502. Since the magnetization direction of the overlapping section of the input track 502 corresponds to binary 0 or 1, information stored in the input track 502 can be encoded in the polarization angle of the polarized spin wave after passing by the overlapping section of the input track 502. Therefore, a reading process can be realized by encoding the information in the polarization angle of the polarized spin wave.

The output track 503 includes at least one output-track magnetic domain 5031, and each of the at least one output-track magnetic domain 5031 can include at least one output-track storage unit. The at least one output-track storage unit can be configured to store binary 0 or 1. Binary 0 or 1 can correspond to a magnetization direction of the at least one output-track magnetic domain 5031 and hence of the at least one output-track storage unit. In some embodiments, a magnetization of each of the at least one output-track magnetic domain 5031 points approximately in the first direction or approximately in the second direction. For example, if the magnetization direction of an output-track magnetic domain 5031 points in approximately the first direction and the first direction is the downward direction, then the at least one output-track storage unit of the output-track magnetic domain 5031 stores binary 0; and if the magnetization direction of an output-track magnetic domain 5031 points in approximately the second direction and the second direction is the upward direction, then the at least one output-track storage unit of the output-track magnetic domain 5031 stores binary 1.

In some embodiments, the computing device 500 further includes an output-track driving device (not shown in FIG. 5) coupled to the output track 503. The output-track driving device can be configured to drive one of at least one output-track storage unit into and out of an overlapping section of the output track 503, e.g., via current-driven domain wall motion. The overlapping section of the output track 503 refers to a section of the output track 503 that overlaps the logic track 501. In some embodiments, the output-track driving device can be configured to provide the clocked electric current to drive one of at least one output-track storage unit into and out of the overlapping section of the output track 503 via current-driven domain wall motion.

As shown in FIG. 5, a natural position of the logic-track domain wall is located at $P_1$. $P_1$ is a position of the interface between the first one of the two logic-track magnetic domains and the second one of the two logic-track magnetic domains, when the polarized spin wave is not injected into the logic track 501. When the polarized spin wave is injected into the logic track 501 and the polarization angle of the polarized spin wave after passing by the overlapping section of the input track 502 is outside a certain range (which is also referred to as a "shifting range"), the logic-track domain wall can stay at position $P_1$. When the polarization angle of the polarized spin wave after passing by the overlapping section of the input track 502 is within the shifting range, the logic-track domain wall can be pushed to move (shift) across the logic track 501 to a position $P_2$. That is, the interface between the first one of the two logic-track magnetic domains and the second one of the two logic-track magnetic domains can be moved to position $P_2$. As such, the position of the logic-track domain wall can be modulated by the polarization angle of the polarized spin wave after passing by the overlapping section of the input track 502.

In some embodiments, $P_1$ can be a position after the first position, where the input track 502 crosses the logic track 501, and before the second position, where the output track 503 crosses the logic track 501. $P_2$ can be a position after the second position where the output track 503 crosses the logic track 501. In this situation, the output track 503 can be located at the second one of the two logic-track magnetic domains, when the polarization angle of the polarized spin wave after passing by the overlapping section of the input track 502 is outside the shifting range, and the output track 503 can be located at the first one of the two logic-track magnetic domains, when the polarization angle of the polarized spin wave after passing by the overlapping section of the input track 502 is within the shifting range. Because the magnetization of the logic track 501 at the overlapping section of the output track 503 can affect the magnetization of the output track 503 via the antiferromagnetic coupling between the logic track 501 and the output track 503, e.g., the magnetization (such as magnetization direction) of the output track 503 can depend on the magnetization of the logic track 501 at the location corresponding to the overlapping section of the output track 503, the magnetization direction of the output track 503 can be modulated by the polarization angle of the polarized spin wave after passing by the overlapping section of the input track 502. Therefore, a writing process can be realized by drive the logic-track domain wall motion by the polarization angle of the polarized spin wave after passing by the overlapping section of the input track 502.

In some embodiments, each of the at least one input-track storage unit and the at least one output-track storage unit can have an approximate same width as the logic track 501 or can be slightly wider than the logic track 501, and each of the at least one input-track storage unit and the at least one output-track storage unit can have a length less than the logic track 501. A width direction of the at least one input-track storage unit or the at least one output-track storage unit is a direction that crosses the logic track 501.

Figure 6:
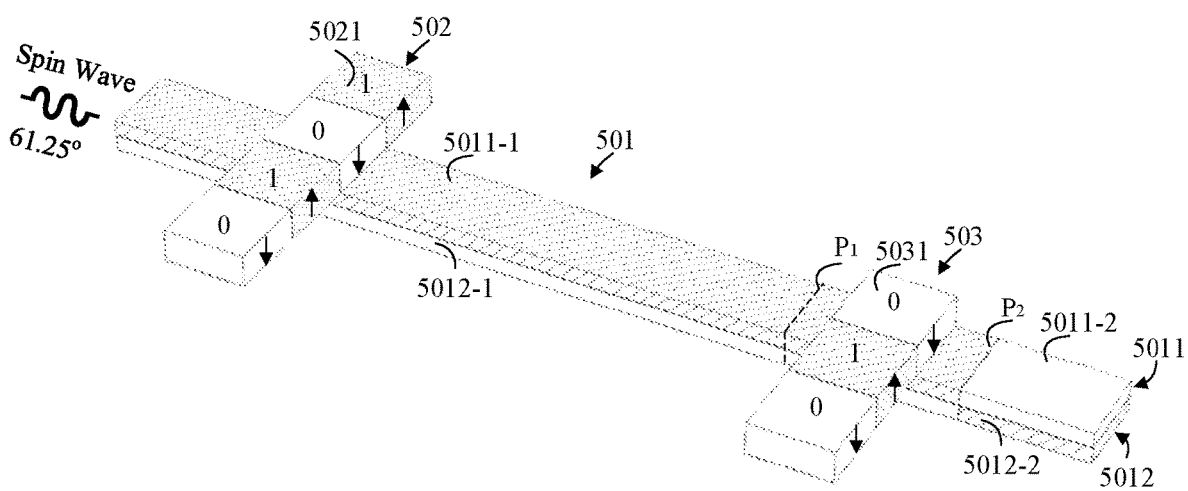
FIG. 6 is a schematic diagram of a CLONE gate according to an embodiment of the disclosure.

Using the structure of the computing device 500 in FIG. 5, a CLONE gate can be realized. FIG. 6 is a schematic diagram of a CLONE gate 600 consistent with the disclosure.

Consistent with the disclosure, a shifting range of the polarization angle of the polarized spin wave after passing by the overlapping section of the input track 502 can depend on, for example, an amplitude of the spin wave, a frequency of the spin wave, a material property of the logic track 501, and/or a restoring force of the domain wall in the logic track 501. Thus, the polarization angle of the polarized spin wave after passing by the overlapping section of the input track 502 can be configured to be within the shifting range, when one of the at least one input-track storage unit located at the overlapping section of the input track 502 stores binary 0. In this situation, the logic-track domain wall can be pushed to move to position $P_2$, and the magnetization of the first magnetic section 5011-1 at a location corresponding to the overlapping section of the output track 503 can affect the magnetization of one of the at least one output-track storage unit at the overlapping section of the output track 503 via the antiferromagnetic coupling between the first magnetic section 5011-1 and the output track 503. The magnetization direction of the first magnetic section 5011-1 can be configured to be opposite to the magnetization direction of the one of the at least one input-track storage unit that stores binary 0, causing the magnetization direction of the one of the at least one output-track storage unit at the overlapping section of the output track 503 to be the same as the magnetization direction of the input-track storage unit that stores binary 0. As such, the CLONE-0 operation that writes binary 0 stored in the input-track storage unit to the output-track storage unit can be realized.

The polarization angle of the polarized spin wave after passing by the overlapping section of the input track 502 can be configured to be outside the shifting range, when one of the at least one input-track storage unit located at the overlapping section of the input track 502 stores binary 1. In this situation, the logic-track domain wall can stay at position $P_1$, and the magnetization of the second magnetic section 5011-2 at a location corresponding to the overlapping section of the output track 503 can affect the magnetization of one of the at least one output-track storage unit at the overlapping section of the output track 503 via the antiferromagnetic coupling between the second magnetic section 5011-2 and the output track 503. The magnetization direction of the second magnetic section 5011-2 can be configured to be opposite to the magnetization direction of the one of the at least one input-track storage unit that stores binary 1, causing the magnetization direction of the one of the at least one output-track storage unit at the overlapping section of the output track 503 to be the same as the magnetization direction of the of the input-track storage unit that stores binary 1. As such, the CLONE-1 operation that writes binary 1 stored in the input-track storage unit to the output-track storage unit can be realized.

For example, as shown in FIG. 6, the magnetization directions of the first magnetic section 5011-1 and the fourth magnetic section 5012-2 point up, and the magnetization directions of the second magnetic section 5011-2 and the third magnetic section 5012-1 point down. Binary 0 corresponds to the magnetization direction of the at least one input-track magnetic domain 5021 pointing down and binary 1 corresponds to the magnetization direction of the at least one input-track magnetic domain 5021 pointing up. The polarized spin wave having the polarization angle of 61.25° is injected into the logic track 501 from the spin wave injecting end of the logic track 501. The length of the input track 502, the thickness of the first spacer layer between the first magnetic section 5011-1 and the third magnetic section 5012-1 of the logic track 501, the thickness of the second spacer layer between the input track 502 and the logic track 501, the frequency of the polarized spin wave, the material properties of the first magnetic layer and the second magnetic layer, and/or the like, can be chosen to cause a rotation angle of +28.75° for binary 0 and a rotation angle of −16.25° for binary 1. Therefore, when one of the at least one input-track storage unit located at the overlapping section of the input track 502 stores binary 0, the polarization angle of the polarized spin wave after passing by the overlapping section of the input track 502 can be equal to 61.25°+28.75°=90°. When one of the at least one input-track storage unit located at the overlapping section of the input track 502 stores binary 1, the polarization angle of the polarized spin wave after passing by the overlapping section of the input track 502 can be equal to 61.25°−16.25°=45°.

In some embodiments, the shifting range can be configured to be, for example, from 68° to 112°. Hence, when binary 0 is stored in the input-track storage unit, the polarization angle of the polarized spin wave after passing by the overlapping section of the input track 502 is 90°, which is within the shifting range. Thus, the domain wall can be pushed to move across the output track 503 to position $P_2$, and the magnetization of the first magnetic section 5011-1 at the location corresponding to the overlapping section of the output track 503 can affect the magnetization of one of the at least one output-track storage unit at the overlapping section of the output track 503 via the antiferromagnetic coupling between the first magnetic section 5011-1 and the output track 503. In this situation, the magnetization direction of the one of the at least one output-track storage unit at the overlapping section of the output track 503 is opposite to the magnetization direction of the first magnetic section

5011-1. That is, the magnetization direction of the one of the at least one output-track storage unit at the overlapping section of the output track 503 points down. As such, binary 0 that is stored in the input-track storage unit is written into ("cloned" to) the output track 503.

Similarly, when binary 1 is stored in the input-track storage unit, the polarization angle of the polarized spin wave after passing by the overlapping section of the input track 502 is 45°, which is outside the shifting range. Thus, the domain wall can stay at position $P_1$, and the magnetization of the second magnetic section 5011-2 at a location corresponding to the overlapping section of the output track 503 can affect the magnetization of the one of the at least one output-track storage unit at the overlapping section of the output track 503 via the antiferromagnetic coupling between the second magnetic section 5011-2 and the output track 503. In this situation, the magnetization direction of the one of the at least one output-track storage unit at the overlapping section of the output track 503 is opposite to the magnetization direction of the second magnetic section 5011-2. That is, the magnetization direction of the one of the at least one output-track storage unit at the overlapping section of the output track 503 points up. As such, binary 1 that is stored in the input-track storage unit is written into ("cloned" to) the output track 503.

Figure 7:
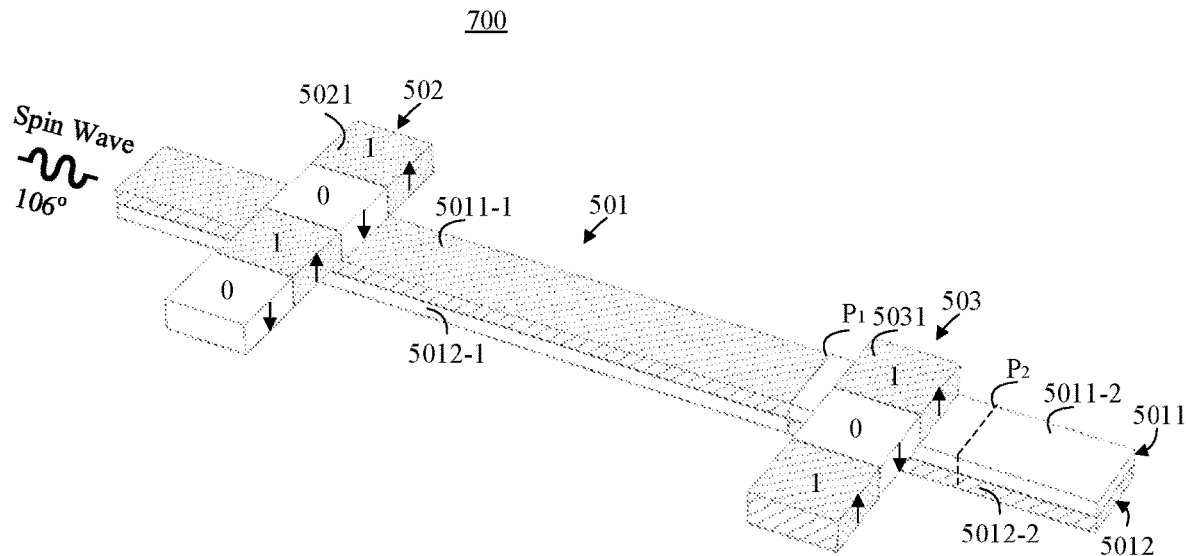
FIG. 7 is a schematic diagram of a NOT gate according to an embodiment of the disclosure.

Using the structure of the computing device 500 in FIG. 5, a NOT gate can also be realized. FIG. 7 is a schematic diagram of a NOT gate 700 consistent with the disclosure.

The polarization angle of the polarized spin wave after passing by the overlapping section of the input track 502 can be configured to be outside the shifting range, when one of the at least one input-track storage unit located at the overlapping section of the input track 502 stores binary 0. In this situation, the logic-track domain wall can stay at position $P_1$, and the magnetization of the second magnetic section 5011-2 at a location corresponding to the overlapping section of the output track 503 can affect the magnetization of one of the at least one output-track storage unit at the overlapping section of the output track 503 via the antiferromagnetic coupling between the second magnetic section 5011-2 and the output track 503. The magnetization direction of the second magnetic section 5011-2 can be configured to be aligned with the magnetization direction of the one of the at least one input-track storage unit that stores binary 0, causing the magnetization direction of the one of the at least one output-track storage unit at the overlapping section of the output track 503 to be opposite to the magnetization direction of the input-track storage unit that stores binary 0. As such, the NOT-0 operation that writes binary 1 to the output-track storage unit in response to binary 0 stored in the input-track storage unit can be realized.

The polarization angle of the polarized spin wave after passing by the overlapping section of the input track 502 can be configured to be within the shifting range, when one of the at least one input-track storage unit located at the overlapping section of the input track 502 stores binary 1. In this situation, the logic-track domain wall can be pushed to move to position $P_2$, and the magnetization of the first magnetic section 5011-1 at a location corresponding to the overlapping section of the output track 503 can affect the magnetization of the one of the at least one output-track storage unit at the overlapping section of the output track 503 via the antiferromagnetic coupling between the first magnetic section 5011-1 and the output track 503. The magnetization direction of the first magnetic section 5011-1 can be configured to be aligned with the magnetization direction of the one of the at least one input-track storage unit that stores binary 1, causing the magnetization direction of the one of the at least one output-track storage unit at the overlapping section of the output track 503 to be opposite to the magnetization direction of the input-track storage unit that stores binary 1. As such, the NOT-1 operation that writes binary 0 to the output-track storage unit in response to binary 1 stored in the input-track storage unit can be realized.

As shown in FIG. 7, the NOT gate 700 is similar to the CLONE gate 600 shown in FIG. 6. To realize the NOT gate 700, the polarization angle of the polarized spin wave injected into the logic track 501 from the spin wave injecting end of the logic track 501 can be different from that for realizing the CLONE gate 600. For example, the polarization angle of the injected polarized spin wave can be 106° for realizing the NOT gate 700 as shown in FIG. 7. Hence, when binary 0 is stored in the input-track storage unit, the polarization angle of the polarized spin wave after passing by the overlapping section of the input track 502 is 106°+28.75°=134.75°, which is outside the shifting range (68° to 112°). Thus, the domain wall can stay at position $P_1$, and the magnetization of the second magnetic section 5011-2 at the location corresponding to the overlapping section of the output track 503 can affect the magnetization of the one of the at least one output-track storage unit at the overlapping section of the output track 503 via the antiferromagnetic coupling between the second magnetic section 5011-2 and the output track 503. In this situation, the magnetization direction of the one of the at least one output-track storage unit at the overlapping section of the output track 503 is opposite to the magnetization direction of the second magnetic section 5011-2. That is, the magnetization direction of the one of the at least one output-track storage unit at the overlapping section of the output track 503 points up. As such, binary 1 that is opposite to binary 0 stored in the input-track storage unit is written into the output track 503.

Similarly, when binary 1 is stored in the input-track storage unit, the polarization angle of the polarized spin wave after passing by the overlapping section of the input track 502 is 106°−16.25°=89.75°, which is within the shifting range. Thus, the domain wall can be pushed to move across the output track 503 to position $P_2$, and the magnetization of the first magnetic section 5011-1 at the location corresponding to the overlapping section of the output track 503 can affect the magnetization of the one of the at least one output-track storage unit at the overlapping section of the output track 503 via the antiferromagnetic coupling between the first magnetic section 5011-1 and the output track 503. In this situation, the magnetization direction of the one of the at least one output-track storage unit at the overlapping section of the output track 503 is opposite to the magnetization direction of the first magnetic section 5011-1. That is, the magnetization direction of the one of the at least one output-track storage unit at the overlapping section of the output track 503 points down. As such, binary 0 that is opposite to binary 1 stored in the input-track storage unit is written into the output track 503.

Figure 8:
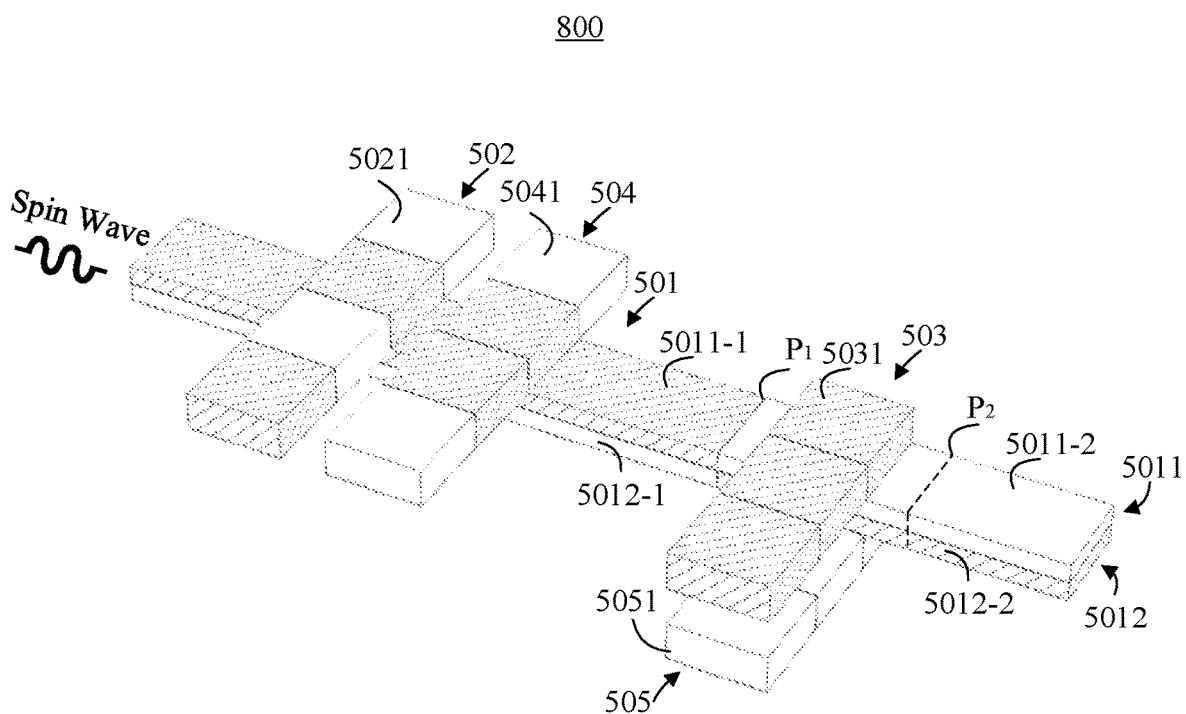
FIG. 8 is a schematic diagram of another computing device according to an embodiment of the disclosure.

FIG. 8 is a schematic diagram of a computing device 800 consistent with the disclosure. The computing device 800 shown in FIG. 8 is similar to the computing device 500 shown in FIG. 5, except that the computing device 800 further includes another input track 504 and another output track 505. The input track 502 is also referred to as a first input track 502, the at least one input-track magnetic domain 5021 is also referred to as at least one first input-track magnetic domain 5021, and the at least one input-track storage unit of the input track 502 is also referred to as at least one first input-track storage unit. The output track 503 is also referred to as a first output track 503, the at least one output-track magnetic domain 5031 is also referred to as at least one first output-track magnetic domain 5031, and the at least one output-track storage unit of the output track 503 is also referred to as at least one first output-track storage unit. The input track 504 is also referred to as a second input track 504 and the output track 505 is also referred to as a second output track 505.

The second input track 504 is arranged crossing the logic track 501 at a third position of the logic track 501. In some embodiments, the third position can be near the first position and can be located at the first one of the two logic-track magnetic domains. For example, as shown in FIG. 8, the second input track 504 is arranged at the third position farther away from the spin wave injecting end of the logic track 501 than the first position. The second output track 505 can be arranged crossing the logic track 501 at a position of the logic track 501 that corresponds to the second position of the logic track 501. In some embodiments, the second output track 505 can be near the logic-track domain wall and can be located at the second one of the two logic-track magnetic domains. In some embodiments, the first input track 502 and the second input track 504 can be arranged approximately parallel to each other and approximately perpendicular to the logic track 501. Further, the first output track 503 and the second output track 505 can be arranged on opposite sides of the logic track 501 and approximately parallel to each other, and approximately perpendicular to the logic track 501. In some embodiments, the second input track 504 and the second output track 505 can be arranged above the logic track 501 or can be arranged below the logic track 501. For example, as shown in FIG. 8, the second output track 505 is arranged below the logic track 501 at the position of the logic track 501 that corresponds to the second position of the logic track 501.

In some embodiments, the second input track 504 can include at least one second input-track magnetic domain 5041, and each of the at least one second input-track magnetic domain can include at least one second input-track storage unit configured to store binary 0 or 1. Binary 0 or 1 can correspond to a magnetization direction of the at least one input-track magnetic domain 5041 and hence of the at least one second input-track storage unit. In some embodiments, the magnetization of each of the at least one input-track magnetic domain 5041 can point approximately in the first direction or approximately in the second direction. For example, if the magnetization of a second input-track magnetic domain 5041 points in approximately the first direction and the first direction is the downward direction, then the at least one second input-track storage unit of the magnetic domain 5041 stores binary 0. On the other hand, if the magnetization direction of a second input-track magnetic domain 5041 points in approximately the second direction and the second direction is the upward direction, then the at least one second input-track storage unit of the second input-track magnetic domain 5041 stores binary 1.

In some embodiments, the second output track 505 can include at least one second output-track magnetic domain 5051, and each of the at least one second output-track magnetic domain can include at least one second output-track storage unit configured to store binary 0 or 1. Binary 0 or 1 can correspond to a magnetization direction of the at least one output-track magnetic domain 5051 and hence of the at least one second output-track storage unit. In some embodiments, a magnetization of each of the at least one output-track magnetic domain 5051 points approximately in the first direction or approximately in the second direction. For example, if the magnetization direction of an output-track magnetic domain 5051 points in approximately the first direction and the first direction is the downward direction, then the at least one second output-track storage unit of the output-track magnetic domain 5051 stores binary 0; and if the magnetization direction of a second output-track magnetic domain 5051 points in approximately the second direction and the second direction is the upward direction, then the at least one second output-track storage unit of the output-track magnetic domain 5051 stores binary 1.

In some embodiments, the input-track driving device is also coupled to the second input track 504 and also configured to drive one of the at least one second input-track storage unit into and out of an overlapping section of the second input track 504, e.g., via current-driven domain wall motion. In some other embodiments, the input-track driving device is a first input-track driving device and the computing device 800 can further include a second input-track driving device (not shown in FIG. 8) coupled to the second input track 504. The second input-track driving device can be configured to drive one of the at least one second input-track storage unit into and out of the overlapping section of the second input track 504, e.g., via current-driven domain wall motion. The overlapping section of the second input track 504 refers to a section of the second input track 504 that overlaps the logic track 501. In some embodiments, the second input-track driving device can also be configured to provide a clocked electric current to drive one of the at least one second input-track storage unit into and out of the overlapping section of the second input track 504.

In some embodiments, the output-track driving device is also coupled to the second output track 505 and also configured to drive one of the at least one second output-track storage unit into and out of an overlapping section of the second output track 505, e.g., via current-driven domain wall motion. In some other embodiments, the output-track driving device is a first output-track driving device and the computing device 800 can further include a second output-track driving device (not shown in FIG. 8) coupled to the second output track 505. The second output-track driving device can be configured to drive one of the at least one second output-track storage unit into and out of the overlapping section of the second output track 505, e.g., via current-driven domain wall motion. The overlapping section of the second output track 505 refers to a section of the second output track 505 that overlaps the logic track 501. In some embodiments, the second output-track driving device can also be configured to provide a clocked electric current to drive one of the at least one second output-track storage unit into and out of the overlapping section of the second output track 505.

In some embodiments, each of the at least one second input-track storage unit and the at least one second output-track storage unit can have a same width as the logic track 501 or be slightly wider than the logic track 501. Further, each of the at least one second input-track storage unit and the at least one second output-track storage unit can have a length less than the logic track 501. A width direction of the at least one second input-track storage unit or the at least one second output-track storage unit is a direction that crosses the logic track 501.

In some embodiments, three or more input tracks and/or three or more output tracks can be arranged. The present disclosure does not limit the number of input tracks and the number of output tracks.

The first input track 502 and the second input track 504 can have four input combinations, i.e., 00, 10, 01, and 11, and each of the first output track 503 and the second output track 505 can have two possible outputs, i.e., 0 or 1. Therefore, $2^3=8$ distinct gates, such as OR, AND, NOR, NAND, XOR, XNOR, or the like, can be realized, based on the structure of the computing device 800, examples of which are described below.

Figure 9:
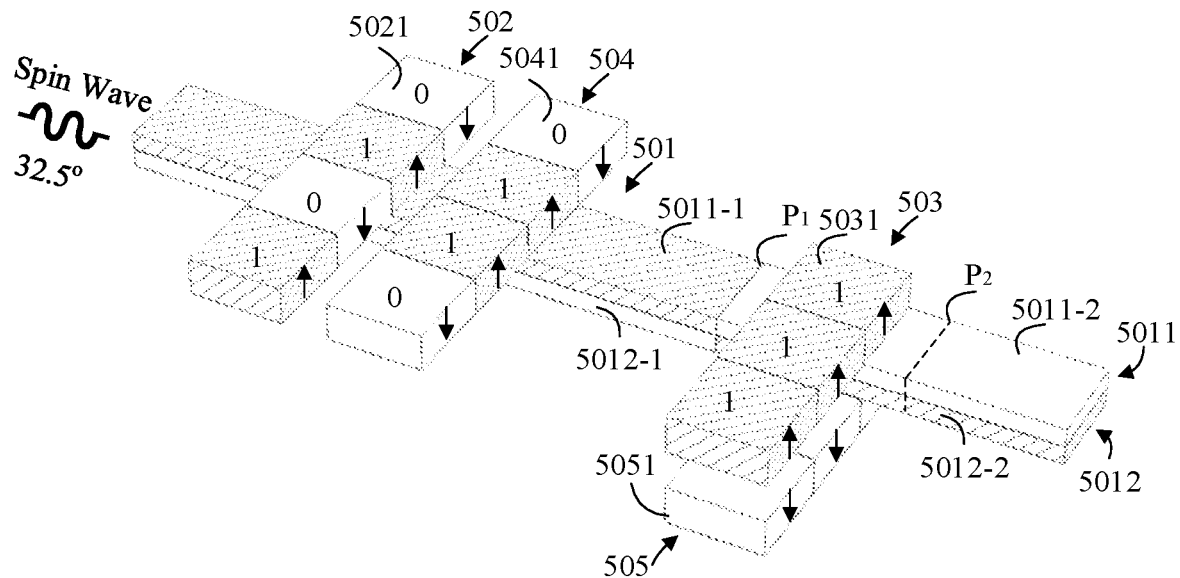
FIG. 9 is a schematic diagram of an OR/NOR gate according to an embodiment of the disclosure.

For example, using the structure of the computing device 800 in FIG. 8, an OR/NOR gate can be realized. FIG. 9 is a schematic diagram of a combined OR/NOR gate 900 consistent with the disclosure.

In some embodiments, as shown in FIG. 9, the first output track 503 and the second output track 505 are approximately parallel to each other and approximately perpendicular to the logic track 501. The first output track 503 and the second output track 505 are arranged above and below the logic track 501, respectively. The position of the first output track 503 and the position of the second output track 505 correspond to each other. For example, an orthogonal projection of the first output track 503 on the logic track 501 can overlap, e.g., completely overlap, an orthogonal projection of the second output track 505 on the logic track 501. Since all adjacent layers are coupled antiferromagnetically, the first output track 503 arranged above the logic track 501 and the second output track 505 arranged below the logic track 501 can yield opposite binaries. For example, if the first output track 503 outputs binary 0, the second output track 505 outputs binary 1. Hence, the structure 900 can realize both OR and NOR functions at the same time.

In some embodiments, the first input track 502 and the second input track 504 are approximately parallel to each other and approximately perpendicular to the logic track 501, and the first input track 502 and the second input track 504 are both arranged above the logic track 501. Because the polarization rotation caused by binary 0 and binary 1 are opposite, the overall rotation caused by the first input track 502 and the second input track 504 can be enhanced when one of the at least one first input-track storage unit at the overlapping section of the first input track 502 and one of the at least one second input-track storage unit at the overlapping section of the second input track 504 have the same binary (e.g., 00 or 11), or can be reduced when the one of the at least one first input-track storage unit at the overlapping section of the first input track 502 and the one of the at least one second input-track storage unit at the overlapping section of the second input track 504 have different binaries (e.g., 01 or 10).

The polarization angle of the polarized spin wave after passing by the overlapping sections of the first input track 502 and the second input track 504 can be configured to be within the shifting range for input 00, i.e., the one of the at least one input-track storage unit located at the overlapping section of the first input track 502 and the one of the at least one second input-track storage unit located at the overlapping section of the second input track 504 both store binary 0. In this situation, the logic-track domain wall can be pushed to move to position $P_2$. As a result, the first output track 503 can output binary 0 and correspondingly the second output track 505 can output binary 1. The polarization angle of the polarized spin wave after passing by the overlapping section of the first input track 502 and the second input track 504 can be configured to be outside the shifting range for other inputs, i.e., 01, 10, and 11. In this situation, the logic-track domain wall can stay at position $P_1$. As a result, the first output track 503 can output binary 1 and correspondingly the second output track 505 can output binary 0. That is, the OR gate can be realized in the first output track 503 and the NOR gate can be realized in the second output track 505.

For example, similar to the embodiments described above in connection with FIGS. 6 and 7, properties such as the material properties and structural properties of the computing device 900 and the frequency of the spin waves can be chosen such that binary 0 may cause a rotation angle of +28.75° and binary 1 may cause a rotation angle of −16.25°. Correspondingly, input 00 can cause a total rotation angle of 2×28.75°=57.5°, input 11 can cause a total rotation angle of −16.25°×2=−32.5°, and input 01 or 10 can cause a total rotation angle of 28.75°−16.25°=12.5°.

For example, as shown in FIG. 9, the polarized spin wave having the polarization angle of 32.5° is injected into the logic track 501 from the spin wave injecting end of the logic track 501. The polarization angle of the polarized spin wave after passing by the overlapping sections of the first input track 502 and the second input track 504 can be equal to 32.5°+57.5°=90° for input 00, equal to 32.5°−32.5°=0° for input 11, and equal to 32.5°+12.5°=45° for input 01 or input 10. The shifting range can be configured to be, for example, from 67.5° to 112.5°. Therefore, for input 00, the polarization angle of the polarized spin wave after passing by the overlapping sections of the first input track 502 and the second input track 504 is within the shifting range. Thus, the logic-track domain wall can be pushed to move across the first output track 503 to position $P_2$ and the first output track 503 can output binary 0. For other inputs, the polarization angle of the polarized spin wave after passing by the overlapping sections of the first input track 502 and the second input track 504 is outside the shifting range. Thus, the logic track domain wall can stay at position $P_1$ and the first output track 503 can output binary 1. As such, the OR gate can be realized in the first output track 503. Since the output binary in the second output track 505 is opposite to that in the first output track 503, the NOR gate can be realized in the second output track 505.

Figure 10:
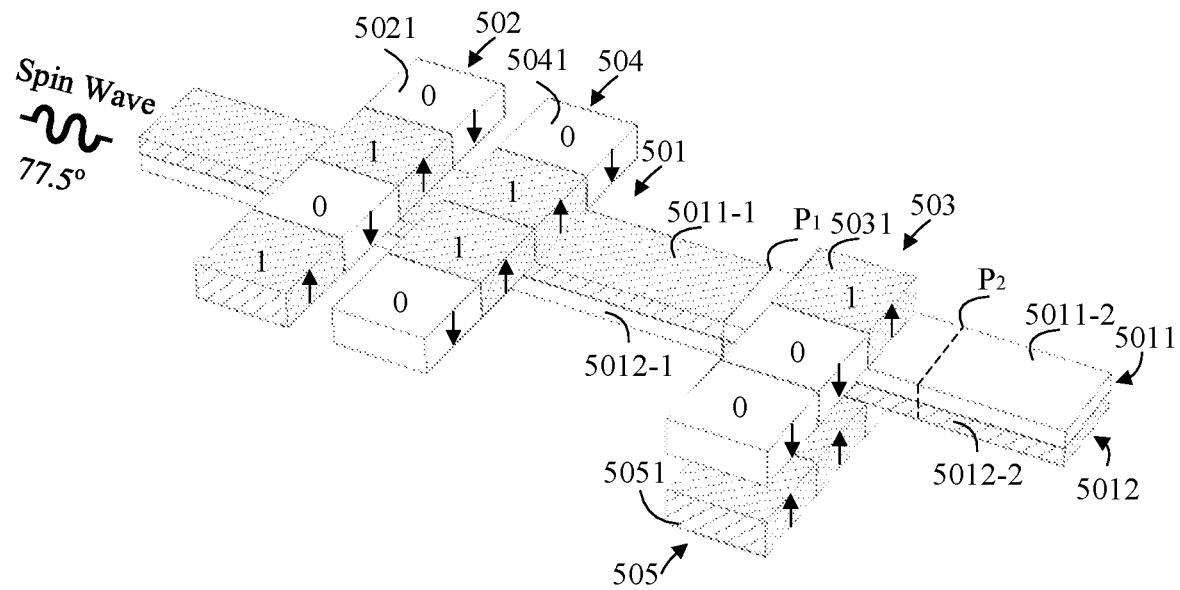
FIG. 10 is a schematic diagram of a XNOR/XOR gate according to an embodiment of the disclosure.

By altering the polarization angle of the polarized spin wave injected into the logic track 501 from the spin wave injecting end of the logic track 501, an XNOR/XOR gate can also be realized using the structure of the computing device 800 in FIG. 8. FIG. 10 is a schematic diagram of a combined XNOR/XOR gate 1000 consistent with the disclosure.

The polarization angle of the polarized spin wave after passing by the overlapping sections of the first input track 502 and the second input track 504 can be configured to be within the shifting range for input 01 or input 10. In this situation, the logic-track domain wall can be pushed to move to position $P_2$. As a result, the first output track 503 can output binary 0 and correspondingly the second output track 505 can output binary 1. The polarization angle of the polarized spin wave after passing by the overlapping section of the first input track 502 and the second input track 504 can be configured to be outside the shifting range for input 00 or input 11. In this situation, the logic-track domain wall can stay at position $P_1$. As a result, the first output track 503 can output binary 1 and correspondingly the second output track 505 can output binary 0. That is, the XNOR gate can be realized in the first output track 503 and the XOR gate can be realized in the second output track 505.

For example, as shown in FIG. 10, the polarized spin wave having the polarization angle of 77.5 degrees is injected into the logic track 501 from the spin wave injecting end of the logic track 501. The polarization angle of the polarized spin wave after passing by the overlapping sections of the first input track 502 and the second input track 504 can be equal to 77.5°+57.5°=135° for input 00, equal to 77.5°−32.5°=45° for input 11, and equal to 77.5°+12.5°=90° for input 01 or input 10. Therefore, for input 01 or input 10, the polarization angle of the polarized spin wave after passing by the overlapping sections of the first input track 502 and the second input track 504 is within the shifting range. Thus, the domain wall can be pushed to move across the first output track 503 to position $P_2$ and the first output track 503 can output binary 0. For other inputs, the polarization angle of the polarized spin wave after passing by the overlapping sections of the first input track 502 and the second input track 504 is outside the shifting range. Thus, the domain wall can stay at position $P_1$ and the first output track 503 can output binary 1. As such, the XNOR gate can be realized in the first output track 503. Since the output binary in the second output track 505 is opposite to that in the first output track 503, the XOR gate can be realized in the second output track 505.

Figure 11:
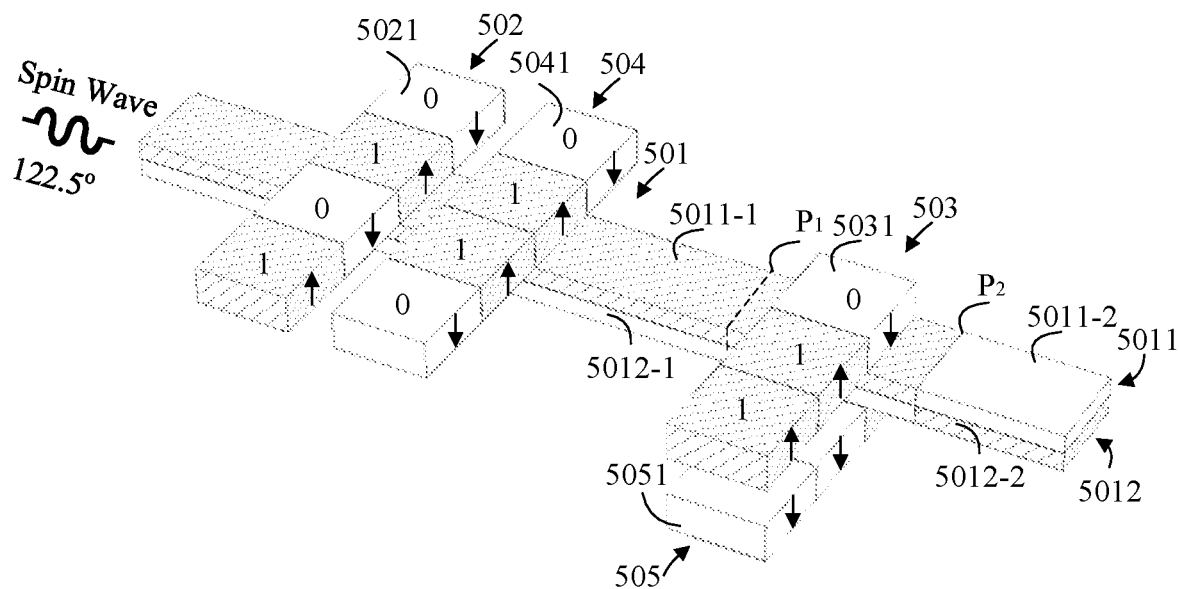
FIG. 11 is a schematic diagram of a NAND/AND gate according to an embodiment of the disclosure.

By altering the polarization angle of the polarized spin wave injected into the logic track 501 from the spin wave injecting end of the logic track 501, an NAND/AND gate can be realized using the structure of the computing device 800 in FIG. 8. FIG. 11 is a schematic diagram of a combined NAND/AND gate 1100 consistent with the disclosure.

The polarization angle of the polarized spin wave after passing by the overlapping sections of the first input track 502 and the second input track 504 can be configured to be within the shifting range for input 11. In this situation, the logic-track domain wall can be pushed to move to position $P_2$. As a result, the first output track 503 can output binary 0 and correspondingly the second output track 505 can output binary 1. The polarization angle of the polarized spin wave after passing by the overlapping sections of the first input track 502 and the second input track 504 can be configured to outside the shifting range for input 00, input 01, or input 10. In this situation, the logic-track domain wall can stay at position $P_1$. As a result, the first output track 503 can output binary 1 and correspondingly the second output track 505 can output binary 0. That is, the NAND gate can be realized in the first output track 503 and the AND gate can be realized in the second output track 505.

For example, as shown in FIG. 11, the polarized spin wave having the polarization angle of 122.5° is injected into the logic track 501 from the spin wave injecting end of the logic track 501. The polarization angle of the polarized spin wave after passing by the overlapping sections of the first input track 502 and the second input track 504 can be equal to 122.5°+57.5°=180° for input 00, equal to 122.5°−32.5°=90° for input 11, and equal to 122.5°+12.5°=135° for input 01 or input 10. Therefore, for input 11, the polarization angle of the polarized spin wave after passing by the overlapping sections of the first input track 502 and the second input track 504 is within the shifting range. Thus, the domain wall can be pushed to move across the first output track 503 to position $P_2$ and the first output track 503 can output binary 0. For other inputs, the polarization angle of the polarized spin wave after passing by the overlapping sections of the first input track 502 and the second input track 504 is outside the shifting range. Thus, the domain wall can stay at position $P_1$ and the first output track 503 can output binary 1. As such, the NAND gate can be realized in the first output track 503. Since the output binary in the second output track 505 is opposite to that in the first output track 503, the AND gate can be realized in the second output track 505.

In the embodiments above, example computing devices having one-input-one-output and two-input-two-output are described. The present disclosure is not limited to such example computing devices. A computing device consistent with the disclosure can have more or less inputs and/or more or less outputs. For example, a computing device consistent with the disclosure can have two input tracks like the example devices shown in FIGS. 8-11, but have only one output track, so as to realize a single OR, NOR, NXOR, XOR, NAND, or AND gate.

Figure 12:
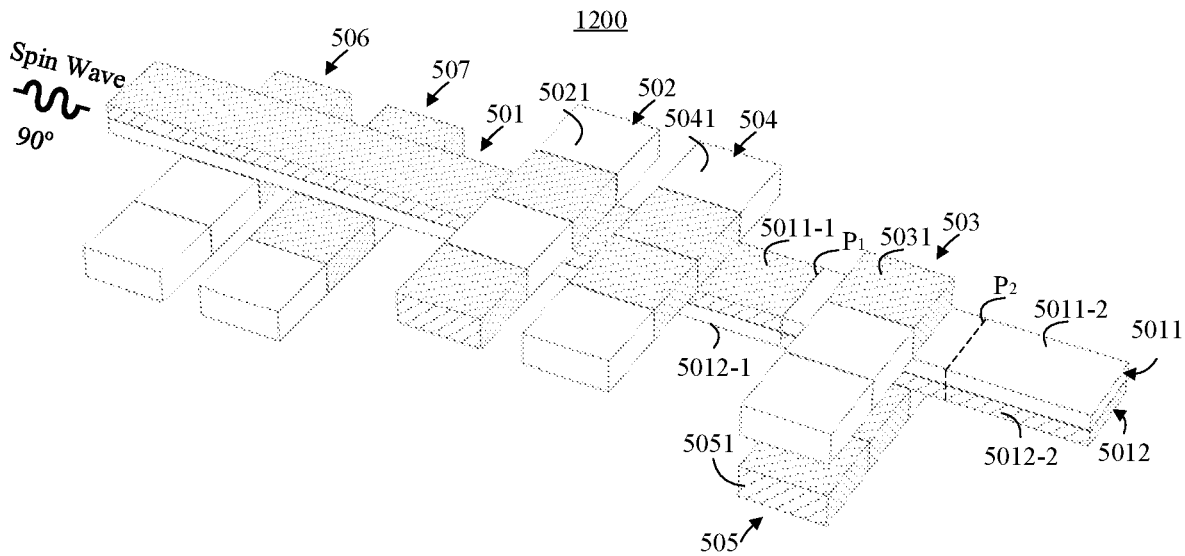
FIG. 12 is a schematic diagram of another computing device according to an embodiment of the disclosure.

FIG. 12 is a schematic diagram of another computing device 1200 consistent with the disclosure. The computing device 1200 shown in FIG. 12 is similar to the computing device 800 shown in FIG. 8, except that the computing device 1200 further includes an instruction track 506 arranged crossing the logic track 501. The instruction track 506 can be configured to change a polarization direction of a spin wave injected from the spin wave injecting end of the logic track 501. In some embodiments, the instruction track 506 can be arranged approximately perpendicular to the logic track 501. In some embodiments, the instruction track 506 can be arranged above the logic track 501 or arranged below the logic track 501.

In some embodiments, the computing device 1200 can further include another instruction track 507 arranged crossing the logic track 501. The instruction track 506 can be referred to as a first instruction track 506 and the instruction track 507 can be referred to as a second instruction track 507. In some embodiments, the first instruction track 506 and the second instruction track 507 can be arranged approximately parallel to each other and approximately perpendicular to the logic track 501. Similar to the first instruction track 506, the second instruction track 507 also can be arranged above the logic track 501 or arranged below the logic track 501. For example, as shown in FIG. 12, the first instruction track 506 and the second instruction track 507 are both arranged below the logic track 501

Each of the first instruction track 506 and the second instruction track 507 can include a plurality of magnetic domains. A magnetization of each of the plurality of magnetic domains points in a first direction or in a second direction approximately opposite to the first direction. A combination of the magnetization of one of the magnetic domains of the first instruction track 506 that overlaps the logic track 501 and the magnetization of one of the magnetic domains of the second instruction track 507 that overlaps the logic track 501 can determine a rotation angle of the polarization direction of the spin wave.

In some embodiments, three or more instruction tracks can be arranged. The present disclosure does not limit the number of instruction tracks.

Consistent with the disclosure, different logic gates, such as CLONE, NOT, OR, AND, NOR, NAND, XOR, XNOR, UNITY, ZERO, or the like, can be realized by controlling the magnetization directions of the overlapping sections of the instruction tracks and/or the polarization angle of the polarized spin wave injected into the logic track 501 from the spin wave injecting end of the logic track 501. In some embodiments, the polarized spin wave having the polarization angle of 90 degrees can be injected into the logic track 501 from the spin wave injecting end of the logic track 501. In these embodiments, when one of the plurality of magnetic domains at an overlapping section of the first instruction track 506 stores binary 1 and one of the plurality of magnetic domains at an overlapping section of the second instruction track 507 stores binary 0, the polarization angle of the polarized spin wave passing through the first instruction track 506 and the second instruction track 507 can be 77.5°. As such, an XNOR and an XOR gate can be realized in the first output track 503 and the second output track 505, respectively. The overlapping section of the first instruction track 506 refers to a section of the first instruction track 506 that overlaps the logic track 501. The overlapping section of the second instruction track 507 refers to a section of the second instruction track 507 that overlaps the logic track 501. Table 1 below lists the logic gates that can be realized using the computing device 1200 by inputting different binary numbers into the instruction track. In Table 1, I and J can correspond to the first instruction track 506 and the second instruction track 507, respectively. K can correspond to the first input track 502, i.e., the first input track 502 is used as an instruction track in this scenario and the logic operation only applies to the data stored in the second input track 504. Further, U and L in Table 1 can correspond to the realized gate in the first output track 503 and the second output track 505, respectively.

TABLE 1

| Instructions | I | 0 | 1 | 0 | 1 | 0 | 1 | 0 | 1 | 0 | 1 |
|---|---|---|---|---|---|---|---|---|---|---|---|
| | J | 0 | 1 | 1 | 0 | 0 | 1 | 1 | 0 | 1 | 0 |
| | K | — | — | — | 0 | 1 | 0 | 1 | 0 | 1 | |
| Realized Gate | U | NAND | | OR | | XNOR | | UNITY | CLONE | NOT | |
| | L | AND | | NOR | | XOR | | ZERO | NOT | CLONE | |

Figure 13:
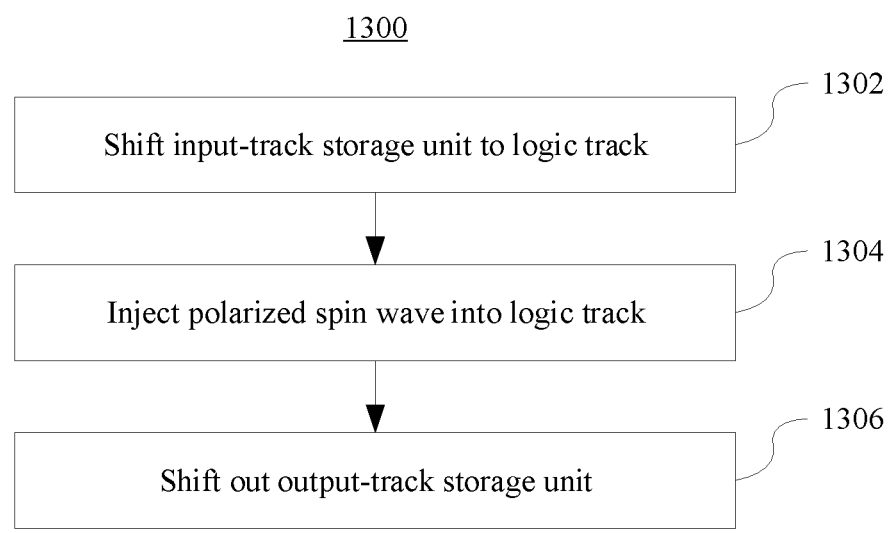
FIG. 13 is a flow chart of a method for logic computing according to an embodiment of the disclosure.

As mentioned above, various logic computations can be realized using a computing device consistent with the disclosure. FIG. 13 is a flow chart of an example method 1300 for logic computing consistent with the disclosure. The method 1300 can be implemented using a computing device consistent with the disclosure, such as one of the example computing devices described above. As shown in FIG. 13, at 1302, at least one input-track storage unit of an input track of the computing device is shifted into an overlapping section of the input track that overlaps a logic track of the computing device. The logic track can include two logic-track magnetic domains separated by a logic-track domain wall. In some embodiments, the logic track includes a first magnetic layer and a second magnetic layer arranged above the first magnetic layer. The first magnetic layer can include a first magnetic section in a first one of the two logic-track magnetic domains and a second magnetic section in a second one of the two logic-track magnetic domains. A magnetization of the first magnetic section can point in a first direction, and a magnetization of the second magnetic section can point in a second direction approximately opposite to the first direction. The first direction and the second direction here can be the same as the first direction and the second direction described above in connection with other embodiments, and the detailed description thereof is omitted. Similarly, the second magnetic layer can include a third magnetic section in the first one of the two logic-track magnetic domains and a fourth magnetic section in the second one of the two logic-track magnetic domains. A magnetization of the third magnetic section can point in the second direction, and a magnetization of the fourth magnetic section can point in the first direction.

At 1304, a polarized spin wave is injected into the logic track. The polarized spin wave can be modulated by the at least one input-track storage unit to carry information. Depending on the data stored in the at least one input-track storage unit, the polarization direction of the polarized spin wave can be rotated for a certain degree or can remain unchanged, and hence the polarization direction of the polarized spin wave can indicate information corresponding to the data stored in the input-track storage unit. Further, depending on the polarization direction of the polarized spin wave, a logic-track domain wall of the logic track may be pushed to pass an output track of the computing device or remain unchanged. Therefore, the information carried by the polarized spin wave can be written into at least one output-track storage unit of the output track in an overlapping section of the output track that overlaps the logic track.

At 1306, the at least one output-track storage unit is shifted out of the overlapping section of the output track to output the data in the output track.

In some embodiments, what logic computation is realized, i.e., the function of the computing device can be controlled by further modulating the polarization direction of the polarized spin wave. For example, the polarization direction of the spin wave can be further modulated by shifting at least one instruction storage unit of an instruction track into an overlapping section of the instruction track that overlaps the logic track. The function realized by the computing device may depend on the data in the at least one instruction storage unit.

Although the processes shown in FIG. 13 are depicted as from one process to another, the present disclosure does not limit the order of the processes. For example, injecting the polarized spin wave (1304) can be performed before, approximately simultaneously with, or after the at least one input-track storage unit is shifted into the overlapping section (1302).

Figure 14A:
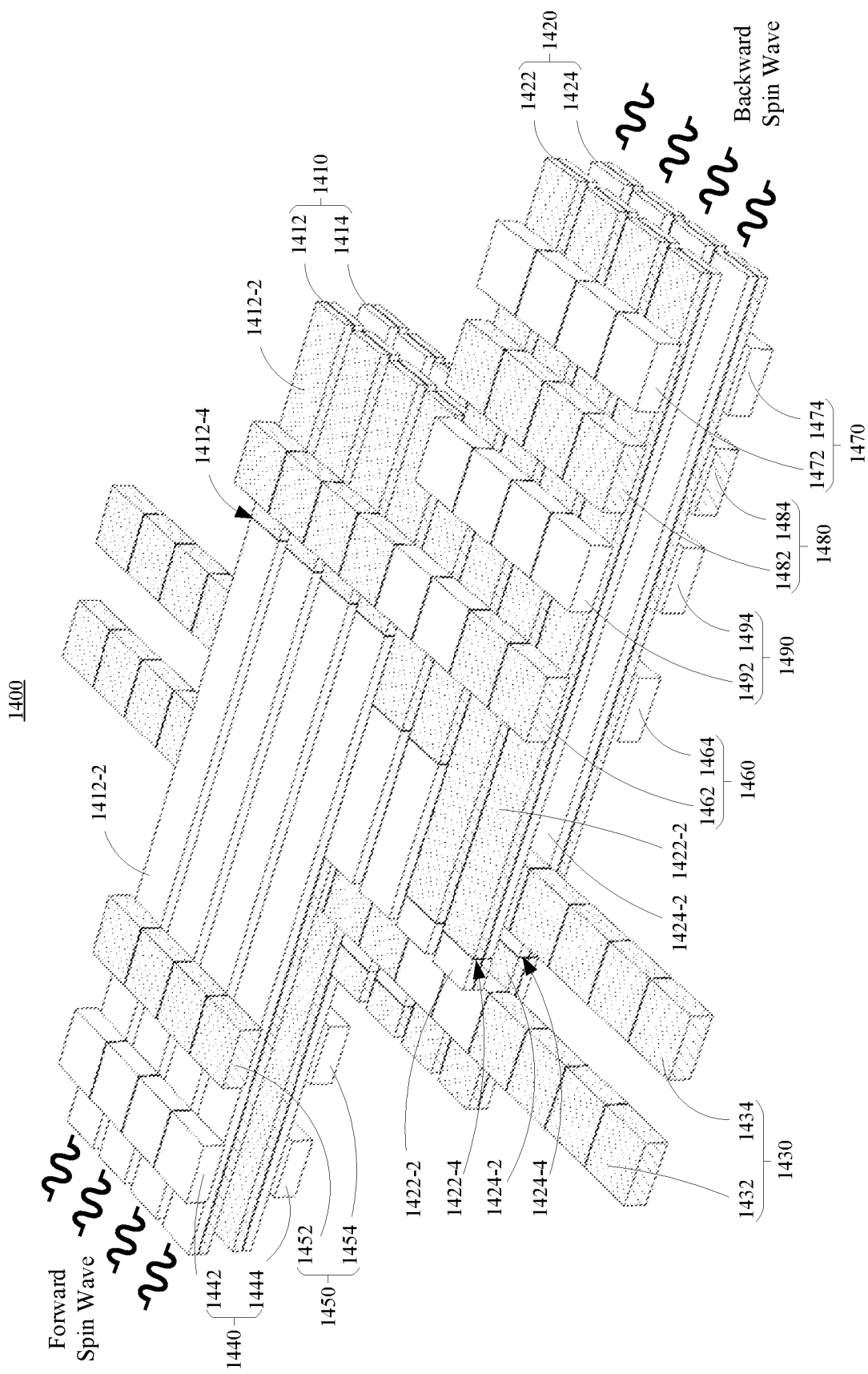
FIGS. 14A-14D are schematic diagrams of a processing device according to an embodiment of the disclosure.
Figure 14B:
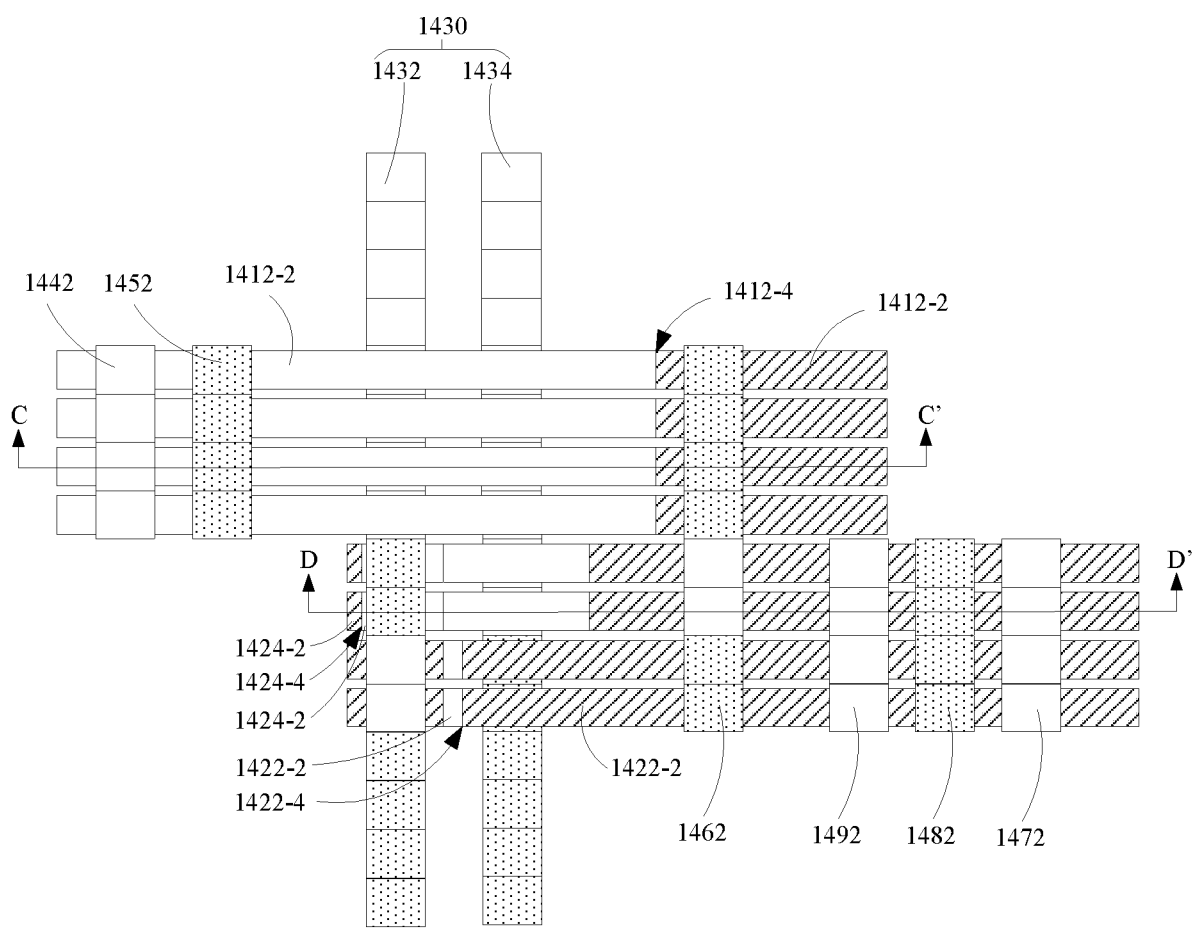
Figure 14C:
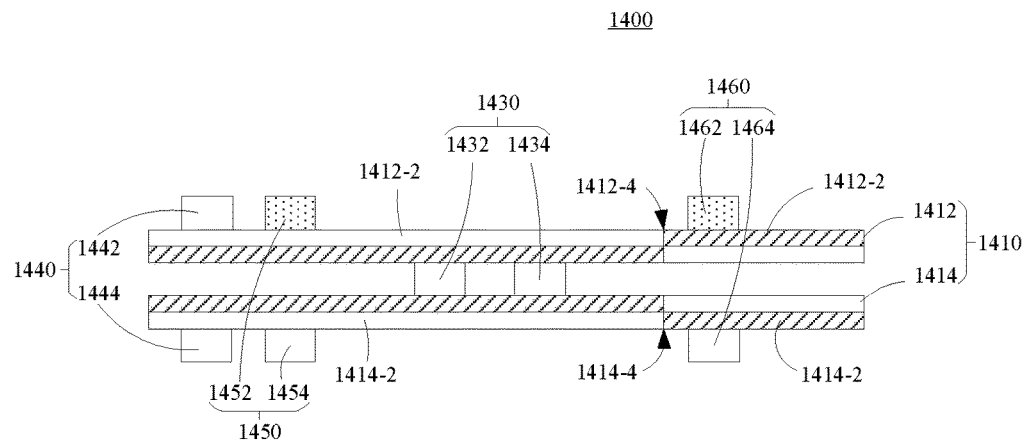
Figure 14D:
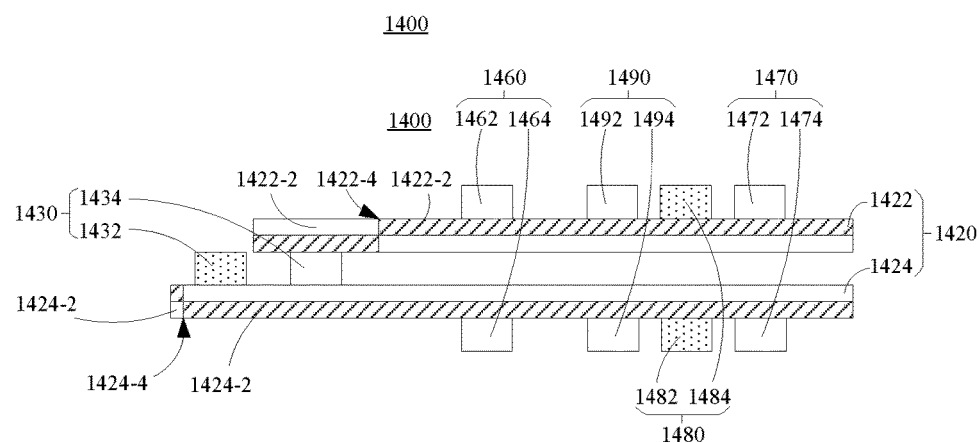

FIGS. 14A-14D are schematic diagrams of an example processing device 1400 consistent with the disclosure. FIG. 14A is a perspective view of the processing device 1400, FIG. 14B is a plan view of the processing device 1400, and FIGS. 14C and 14D are cross-sectional views of the processing device 1400 along CC' line and DD' line in FIG. 14B, respectively. The processing device 1400 can be built based on one or more of the computing devices consistent with the disclosure, such as one or more of the example computing devices described above in connection with FIGS. 4A-12. For the parts of the processing device 1400 that are not described below or not described in detail below, reference can be made to the description of similar parts of the example computing devices above.

In the example shown in FIGS. 14A-14D, the processing device 1400 is configured as an arithmetic logic unit (ALU). In some other embodiments, computing devices consistent with the disclosure can be combined to form various other types of processing devices.

As shown in FIGS. 14A-14D, the processing device 1400 includes a plurality of forward logic track (FLT) pairs 1410 and a plurality of backward logic track (BLT) pairs 1420. In the example shown in FIGS. 14A-14D, the processing device 1400 includes four FLT pairs 1410 and four BLT pairs 1420, and hence can realize four-bit computations. The plurality of FLT pairs 1410, e.g., the four FLT pairs 1410 in FIGS. 14A-14D, form an FLT group. The plurality of BLT pairs 1420, e.g., the four BLT pairs 1420 in FIGS. 14A-14D, form a BLT group.

In some embodiments, as shown in FIGS. 14A and 14B, the four FLT pairs 1410 are arranged one adjacent to another and approximately parallel to each other, and the four BLT pairs 1420 are arranged one adjacent to another and approximately parallel to each other. Each of the FLT pairs 1410 includes an upper FLT 1412 and a lower FLT 1414 arranged approximately parallel to and below the upper FLT 1412. The upper FLTs 1412 of the FLT pairs 1410 form an upper FLT layer, and the lower FLTs 1414 of the FLT pairs 1410 form a lower FLT layer. Similarly, each of the BLT pairs 1420 includes an upper BLT 1422 and a lower BLT 1424 arranged approximately parallel to and below the upper BLT 1422. The upper BLTs 1422 of the BLT pairs 1420 form an upper BLT layer, and the lower BLTs 1424 of the BLT pairs 1420 form a lower BLT layer. The FLTs are approximately parallel to each other, and the BLTs are approximately parallel to each other. In some embodiments, the FLTs are also approximately parallel to the BLTs. In some other embodiments, at least a portion of the FLTs is arranged at a certain angle, such as about 90°, with respect to at least a portion of the BLTs.

Each of the upper FLTs 1412 and the lower FLTs 1414 has a structure similar to the example logic tracks described above, such as an SyAF structure, and is configured to conduct a polarized spin wave injected from a forward spin wave injecting end thereof. The forward spin wave injecting ends of the upper FLTs 1412 and the lower FLTs 1414 are also collectively referred to as a forward spin wave injecting end of the FLT group. Similarly, each of the upper BLTs 1422 and the lower BLTs 1424 is configured to conduct a polarized spin wave injected from a backward spin wave injecting end thereof. The backward spin wave injecting ends of the upper BLTs 1422 and the lower BLTs 1424 are also collectively referred to as a backward spin wave injecting end of the BLT group.

In the present disclosure, the four FLT pairs 1410 are also referred to as a first FLT pair, a second FLT pair, a third FLT pair, and a fourth FLT pair, respectively. Correspondingly, the upper FLTs 1412 of the first, second, third, and fourth FLT pairs are also referred to as first, second, third, and fourth upper FLTs, respectively, and the lower FLTs 1414 of the first, second, third, and fourth FLT pairs are also referred to as first, second, third, and fourth lower FLTs, respectively. Similarly, the four BLT pairs 1410 are also referred to as a first BLT pair, a second BLT pair, a third BLT pair, and a fourth BLT pair, respectively. Correspondingly, the upper BLTs 1422 of the first, second, third, and fourth BLT pairs are also referred to as first, second, third, and fourth BLTs, respectively, and the lower BLTs 1424 of the first, second, third, and fourth BLT pairs are also referred to as first, second, third, and fourth lower BLTs, respectively.

Consistent with the disclosure, each of the upper FLTs 1412, the lower FLTs 1414, the upper BLTs 1422, and the lower BLTs 1424 has a structure similar to that of any of the example logic tracks described earlier in the disclosure. For example, as shown in FIGS. 14A and 14C, an upper FLT 1412 includes two upper FLT magnetic domains 1412-2 separated by an upper FLT domain wall 1412-4, and a lower FLT 1414 includes two lower FLT magnetic domains 1414-2 separated by a lower FLT domain wall 1414-4. An upper FLT magnetic domain or a lower FLT magnetic domain is also simply referred to as an FLT magnetic domains. Similarly, the upper domain wall or the lower FLT domain wall is also simply referred to as an FLT domain wall. Further, as shown in FIGS. 14A and 14D, an upper BLT 1422 includes two upper BLT magnetic domains 1422-2 separated by an upper BLT domain wall 1422-4, and a lower BLT 1424 includes two lower BLT magnetic domains 1424-2 separated by a lower BLT domain wall 1424-4. An upper BLT magnetic domain or a lower BLT magnetic domain is also simply referred to as a BLT magnetic domain, and the upper domain wall or the lower BLT domain wall is also simply referred to as a BLT domain wall.

As shown in FIGS. 14A-14D, the processing device 1400 further includes a data track pair 1430 arranged crossing the FLT group and the BLT group, and including a first data track 1432 and a second data track 1434 arranged approximately parallel to each other. The first data track 1432 and the second data track 1434 can be approximately parallel to each other. Each of the first data track 1432 and the second data track 1434 can be approximately perpendicular to the FLTs and the BLTs.

The first data track 1432 and the second data track 1434 are at least partially sandwiched between the upper FLT layer and the lower FLT layer. Further, at least one of the first data track 1432 or the second data track 1434 is at least partially sandwiched between the upper BLT layer and the lower BLT layer. In some embodiments, one of the upper and lower BLT layers is shorter than the other one of the upper and lower BLT layers, and hence does not overlap the first data track 1432. For example, as shown in FIGS. 14A, 14B, and 14D, the upper BLT layer is shorter than the lower BLT layer and hence does not overlap the first data track 1432. In some embodiments, the processing device 1400 can include more than two data tracks, each being similar to the first data track 1432 or the second data track 1434.

In the present disclosure, each of the first data track 1432 and the second data track 1434 is also simply referred to as a data track. As shown in FIGS. 14A and 14B, a data track, e.g., the first data track 1432 or the second data track 1434, includes a plurality of input storage units each corresponding to one of the plurality of FLT pairs 1410 and configured to store binary 0 or 1. The data track further includes a plurality of output storage units each corresponding to one of the plurality of BLT pairs 1420 and configured to store binary 0 or 1 for output. The input storage units and the output storage units of the first data track 1432 are also referred to as "first input storage units" and "first output storage units," respectively. Similarly, the input storage units and the output storage units of the second data track 1434 are also referred to as "second input storage units" and "second output storage units," respectively.

The input storage units and the output storage units of a data track are both storage units of the data track. When a storage unit is at the FLT group side, the storage unit can be referred to as an input storage unit. Similarly, when a storage unit is at the BLT group side, the storage unit can be referred to as an output storage unit.

In some embodiments, a width of an input storage unit in the direction perpendicular to the longitudinal direction of the FLT group approximately equals or is slightly larger than the width of an FLT. Similarly, a width of an output storage unit in the direction perpendicular to the longitudinal direction of the BLT group approximately equals or is slightly larger than the width of a BLT. The width of the input storage unit is not limited, as long as it can effectively rotate the polarization of the spin wave in the corresponding FLT, i.e., the FLT that overlaps the input storage unit. Similarly, the width of the output storage unit is not limited, as long as it can be effectively modified by the magnetization in the corresponding BLT, i.e., the BLT that overlaps the output storage unit.

In some embodiments, one or more of the input storage units and the output storage units are in a same magnetic domain having a magnetization pointing approximately in a first direction or approximately in a second direction opposite to the first direction. The magnetization of an input storage unit/output storage unit indicates the binary data, i.e., binary 0 or 1, stored in the input storage unit/output storage unit. The first and second directions are similarly defined as the first and second directions, respectively, in embodiments described above, and hence detailed description thereof is omitted.

In some embodiments, the processing device 1400 further includes one or more data-track driving devices (not shown)

each coupled to one or more of the data tracks and configured to drive the storage units of the one or more of the data tracks to shift. As described above, a data-track driving device can drive the storage units via, for example, current-driven domain wall motion. For a data track, the data-track driving device coupled thereto can drive the input storage units into and out of a section of the data track that overlaps the FLT group and can drive the output storage units into and out of a section of the data track that overlaps the BLT group. The section of the data track that overlaps the FLT group is also referred to as a "forward overlapping section" of the data track, and the section of the data track that overlaps the BLT group is also referred to as a "backward overlapping section" of the data track.

In some embodiments, the first data track 1432 and the second data track 1434 are configured to send data into the processing device 1400 for processing and then read the processing results for output. What processing, e.g., what arithmetic calculation, is performed by the processing device 1400 may depend on, e.g., the configuration of other portions of the processing device 1400, the magnetization directions in other portions of the processing device 1400, and/or the polarizations of the spin waves injected into the processing device 1400, as described in more detail below.

As described above, polarized spin waves can be injected into the FLT group from the forward spin wave injecting end of the FLT group. In some embodiments, one polarized spin wave can be injected into one upper FLT 1412 or one lower FLT 1414 from the forward spin wave injecting end of the upper FLT 1412 or the lower FLT 1414. The processing device 1400 further includes a first forward instruction track pair 1440 and a second forward instruction track pair 1450 arranged crossing the FLT group and configured to set a function of the FLT group by changing the polarization directions of the forward spin waves. For example, the first forward instruction track pair 1440 is configured to change the polarization directions of the forward spin waves. In some embodiments, the second forward instruction track pair 1450 can be arranged at a position between the first forward instruction track pair 1440 and the data track pair 1430 so as to further change the polarization directions of the forward spin waves.

In some embodiments, as shown in FIGS. 14A-14C, the first forward instruction track pair 1440 includes a first upper forward instruction track 1442 arranged crossing the FLT group and a first lower forward instruction track 1444 arranged crossing the FLT group at a position below the first upper forward instruction track 1442. The first upper forward instruction track 1442 and the first lower forward instruction track 1444 can be approximately parallel to each other and approximately perpendicular to the FLT pairs 1410. The first upper forward instruction track 1442 is configured to change a polarization direction of a forward spin wave in the upper FLT layer, which is also referred to as an "upper forward spin wave." The first lower forward instruction track 1444 is configured to change a polarization direction of a forward spin wave in the lower FLT layer, which is also referred to as a "lower forward spin wave."

The second forward instruction track pair 1450 includes a second upper forward instruction track 1452 arranged crossing the FLT group and a second lower forward instruction track 1454 arranged crossing the FLT group at a position below the second upper forward instruction track 1452. The second upper forward instruction track 1452 and the second lower forward instruction track 1454 can be approximately parallel to each other and approximately perpendicular to the FLT pairs 1410. The second upper forward instruction track 1452 is configured to further change the polarization direction of the upper forward spin wave. The second lower forward instruction track 1454 is configured to further change the polarization direction of the lower forward spin wave.

In some embodiments, such as shown in FIGS. 14A-14C, the first upper forward instruction track 1442 and the second upper forward instruction track 1452 are arranged above the upper FLT layer, and the first lower forward instruction track 1444 and the second lower forward instruction track 1454 are arranged below the lower FLT layer. In some embodiments, the first upper forward instruction track 1442, the first lower forward instruction track 1444, the second upper forward instruction track 1452, and the second lower forward instruction track 1454 at least partially sandwich the upper FLT layer and the lower FLT layer.

In some other embodiments, one or more of the first upper forward instruction track 1442, the first lower forward instruction track 1444, the second upper forward instruction track 1452, and the second lower forward instruction track 1454 can be arranged between the upper FLT layer and the lower FLT layer. In some embodiments, one or more of the first upper forward instruction track 1442, the first lower forward instruction track 1444, the second upper forward instruction track 1452, and the second lower forward instruction track 1454 are at least partially sandwiched between the upper FLT layer and the lower FLT layer. For example, the first upper forward instruction track 1442 and the first lower forward instruction track 1444 can be arranged between the upper FLT layer and the lower FLT layer, and the second upper forward instruction track 1452 and the second lower forward instruction track 1454 can be arranged above the upper FLT layer and below the lower FLT layer, respectively. As another example, all of the first upper forward instruction track 1442, the first lower forward instruction track 1444, the second upper forward instruction track 1452, and the second lower forward instruction track 1454 can be arranged between the upper FLT layer and the lower FLT layer.

As shown in FIGS. 14A-14D, the processing device 1400 further includes a register track pair 1460 arranged crossing the FLT group and the BLT group. The register track pair 1460 includes an upper register track 1462 arranged crossing the FLT group and the BLT group, and a lower register track 1464 arranged crossing the FLT group and the BLT group and below the upper register track 1462.

The upper register track 1462 includes an upper forward overlapping section that overlaps the FLT group at a position farther away from the forward spin wave injecting end of the FLT group and an upper backward overlapping section that overlaps the BLT group at a position farther away from the backward spin wave injecting end of the BLT group. The upper register track 1462 includes one or more upper register storage units configured to store information carried by the upper forward spin waves travelling in the upper FLT layer. In some embodiments, each of the one or more upper register storage units can correspond to one of the upper FLTs 1412 and be configured to store information carried by the upper forward spin wave travelling in the corresponding upper FLT 1412.

Similarly, the lower register track 1464 includes a lower forward overlapping section that overlaps the FLT group at a position farther away from the forward spin wave injecting end of the FLT group and a lower backward overlapping section that overlaps the BLT group at a position farther away from the backward spin wave injecting end of the BLT group. The lower register track 1464 includes one or more lower register storage units configured to store information carried by the lower forward spin waves travelling in the lower FLT layer. In some embodiments, each of the one or more lower register storage units can correspond to one of the lower FLTs 1414 and be configured to store information carried by the lower forward spin wave travelling in the corresponding lower FLT 1414.

In some embodiments, such as shown in FIGS. 14A-14D, the upper register track 1462 is arranged above the FLT group and the BLT group and the lower register track 1464 is arranged below the FLT group and the BLT group. In some embodiments, the upper register track 1462 and the lower register track 1464 at least partially sandwich the upper FLT layer, the lower FLT layer, the upper BLT layer, and the lower BLT layer.

In some other embodiments, one or both of the upper register track 1462 and the lower register track 1464 are arranged between the upper FLT layer and the lower FLT layer, and between the upper BLT layer and the lower BLT layer. In some embodiments, one or both of the upper register track 1462 and the lower register track 1464 are partially sandwiched between the upper FLT layer and the lower FLT layer, and between the upper BLT layer and the lower BLT layer. For example, both the upper register track 1462 and the lower register track 1464 can be arranged between the upper FLT layer and the lower FLT layer, and between the upper BLT layer and the lower BLT layer.

In some embodiments, the processing device 1400 may further include one or more register-track driving devices (not shown) each coupled to one or both of the upper register track 1462 and the lower register track 1464. A register-track driving device coupled to the upper register track 1462 can be configured to shift the one or more upper register storage units from the upper forward overlapping section of the upper register track 1462 to the upper backward overlapping section of the upper register track 1462. Similarly, a register-track driving device coupled to the lower register track 1464 can be configured to shift the one or more lower register storage units from the lower forward overlapping section of the lower register track 1464 to the lower backward overlapping section of the lower register track 1464. That is, the one or more register-track driving devices can shift the data stored in the register storage units from the FLT side to the BLT side, so as to modulate the spin waves travelling in the BLTs. In some embodiments, a register-track driving device can shift the register storage units via, for example, current-driven domain wall motion.

Similar to the spin waves travelling in the FLTs that are modulated by the plurality of forward instruction tracks, the spin waves travelling in the BLTs can also be modulated by a plurality of backward instruction tracks that are arranged crossing the BLT group. In some embodiments, as shown in FIGS. 14A, 14B, and 14D, the processing device 1400 includes a first backward instruction track pair 1470, a second backward instruction track pair 1480, and a third backward instruction track pair 1490 arranged crossing the BLT group and configured to set a function of the BLT group by changing the polarization directions of backward spin waves injected from the backward spin wave injecting end of the BLT group and travelling in the BLT group. For example, the first backward instruction track pair 1470 can be configured to change the polarization directions of the backward spin waves. In some embodiments, the second backward instruction track pair 1480 can be arranged at a position between the first backward instruction track pair 1470 and the register track pair 1460, and configured to further change the polarization directions of the backward spin waves. In some embodiments, the third backward instruction track pair 1490 can be arranged at a position between the second backward instruction track pair 1480 and the register track pair 1460, and configured to further change the polarization directions of the backward spin waves.

In some embodiments, as shown in FIGS. 14A, 14B, and 14D, the first backward instruction track pair 1470 includes a first upper backward instruction track 1472 arranged crossing the BLT group and a first lower backward instruction track 1474 arranged crossing the BLT group at a position below the first upper backward instruction track 1472. The first upper backward instruction track 1472 and the first lower backward instruction track 1474 can be approximately parallel to each other and approximately perpendicular to the BLT pairs 1420. The first upper backward instruction track 1472 is configured to change a polarization direction of a backward spin wave in the upper BLT layer, and the first lower backward instruction track 1474 is configured to change a polarization direction of a backward spin wave in the lower BLT layer.

Similarly, the second backward instruction track pair 1480 includes a second upper backward instruction track 1482 arranged crossing the BLT group and a second lower backward instruction track 1484 arranged crossing the BLT group at a position below the second upper backward instruction track 1482. The second upper backward instruction track 1482 and the second lower backward instruction track 1484 can be approximately parallel to each other and approximately perpendicular to the BLT pairs 1420. The second upper backward instruction track 1482 is configured to further change the polarization direction of the backward spin wave in the upper BLT layer, and the second lower backward instruction track 1484 is configured to further change the polarization direction of the backward spin wave in the lower BLT layer.

Similarly, the third backward instruction track pair 1480 includes a third upper backward instruction track 1492 arranged crossing the BLT group and a third lower backward instruction track 1494 arranged crossing the BLT group at a position below the third upper backward instruction track 1492. The third upper backward instruction track 1492 and the third lower backward instruction track 1484 can be approximately parallel to each other and approximately perpendicular to the BLT pairs 1420. The third upper backward instruction track 1492 is configured to further change the polarization direction of the backward spin wave in the upper BLT layer, and the third lower backward instruction track 1494 is configured to further change the polarization direction of the backward spin wave in the lower BLT layer.

In some embodiments, such as shown in FIGS. 14A, 14B, and 14D, the first upper backward instruction track 1472, the second upper backward instruction track 1482, and the third upper backward instruction track 1492 are arranged above the upper BLT layer, and the first lower backward instruction track 1474, the second lower backward instruction track 1484, and the third lower backward instruction track 1494 are arranged below the lower BLT layer. In some embodiments, the first upper backward instruction track 1472, the first lower backward instruction track 1474, the second upper backward instruction track 1482, the second lower backward instruction track 1484, the third upper backward instruction track 1492, and the third lower backward instruction track 1494 at least partially sandwich the upper BLT layer and the lower BLT layer.

In some other embodiments, one or more of the first upper backward instruction track 1472, the first lower backward instruction track 1474, the second upper backward instruction track 1482, and the second lower backward instruction track 1484, the third upper backward instruction track 1492, and the third lower backward instruction track 1494 can be arranged between the upper BLT layer and the lower BLT layer. In some embodiments, one or more of the first upper backward instruction track 1472, the first lower backward instruction track 1474, the second upper backward instruction track 1482, the second lower backward instruction track 1484, the third upper backward instruction track 1492, and the third lower backward instruction track 1494 are at least partially sandwiched between the upper BLT layer and the lower BLT layer. For example, the first upper backward instruction track 1472 and the first lower backward instruction track 1474 can be arranged between the upper BLT layer and the lower BLT layer, and the second upper backward instruction track 1482, the second lower backward instruction track 1484, the third upper backward instruction track 1492, and the third lower backward instruction track 1494 can be arranged above the upper BLT layer or below the lower BLT layer. As another example, the first upper backward instruction track 1472, the first lower backward instruction track 1474, the second upper backward instruction track 1482, and the second lower backward instruction track 1484 can be arranged between the upper BLT layer and the lower BLT layer, and the third upper backward instruction track 1492 and the third lower backward instruction track 1494 can be arranged above the upper BLT layer and below the lower BLT layer, respectively. As a further example, all of the first upper backward instruction track 1472, the first lower backward instruction track 1474, the second upper backward instruction track 1482, the second lower backward instruction track 1484, the third upper backward instruction track 1492, and the third lower backward instruction track 1494 can be arranged between the upper BLT layer and the lower BLT layer.

As mentioned above, in some embodiments of the disclosure, the processing device 1400 is configured as an ALU that can carry out various logic and arithmetic operations, such as, for example, AND, OR, XOR, SHIFT LEFT/RIGHT, ADD. The example processing device shown in FIGS. 14A-14D can realize a full-functional 4-bit ALU using sixteen (16) universal gates (each including one of the four upper FLTs 1412, the four lower FLTs 1414, the four upper BLTs 1422, and the four lower BLTs 1424, and corresponding instruction and data tracks that configure the corresponding logic track and input/output data, respectively). This is much less number of gates as compared to the conventional technologies, which requires over 100 NAND gates to construct a partial-functional 4-bit ALU. The spin wave ALU consistent with the disclosure can carry out not only all unary and binary logic operations, but also advanced arithmetic operations such as SHIFT LEFT/RIGHT and ADD/SUBTRACT with carry-in and -out. Table 2 is a truth table showing binary values at the instruction tracks and data tracks for carrying out a one-bit 1+1=10 operation, and the functions realized at the corresponding logic tracks (note Table 2 only lists the values on one FLT pair and a corresponding BLT pair). In Table 2, G1, G2, G3, G4, and G5 can correspond to the first forward instruction track pair 1440, the second forward instruction track pair 1450, the third backward instruction track pair 1490, the second backward instruction track pair 1480, and the first backward instruction track pair 1470, respectively; A and B can correspond to the first data track 1432 and the second data track 1434, respectively, and R can correspond to the register track pair 1460.

TABLE 2

| ADD 1 + 1 = 10 | | | G1 | G2 | A | B | R | G3 | G4 | G5 |
|---|---|---|---|---|---|---|---|---|---|---|
| FLT | Upper | XOR | 0 | 1 | 1 | 1 | 0 | | | |
| | Lower | AND | 0 | 0 | | | 1 | | | |
| BLT | Upper | CLONE | | | 1 | 0 | 0 | 0 | 1 | 0 |
| | Lower | CLONE | | | | | 1 | 0 | 1 | 0 |

Figure 15:
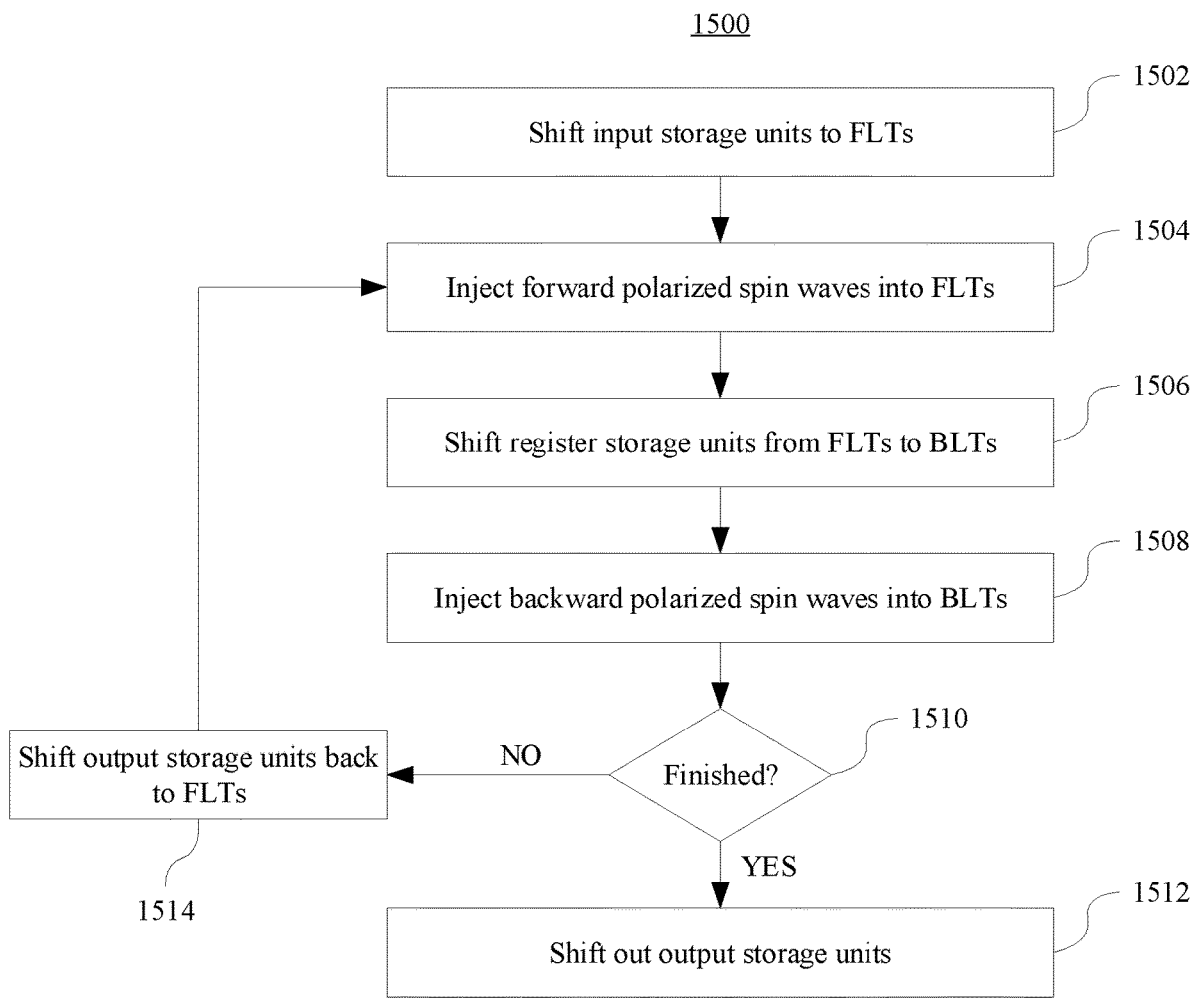
FIG. 15 is a flow chart of a method for logic computing according to another embodiment of the disclosure.

FIG. 15 is a flow chart of an example method 1500 for logic computing consistent with the disclosure. The method 1500 can be implemented, for example, using the processing device 1400 described above. As shown in FIG. 15, at 1502, a plurality of input storage units of a plurality of data tracks are shifted into a plurality of sections of the plurality of data tracks that overlap a plurality of FLTs. The plurality of input storage units can store binary numbers on which a certain binary operation will be performed. In some embodiments, the input storage units can be shifted via current-driven domain wall motion.

At 1504, a plurality of forward polarized spin waves are injected into the plurality of FLTs. The plurality of forward polarized spin waves can be modulated by the plurality of input storage units to carry information. Depending on the data stored in the plurality of input storage units, the polarization direction of each of the forward polarized spin waves can be rotated for a certain degree or can remain unchanged, and hence the polarization directions of the forward polarized spin waves can indicate information corresponding to the data stored in the input storage units. Further, depending on the polarization directions of the forward polarized spin waves, the logic-track domain wall of none, one, or more of the FLTs may be pushed to pass a register track. Therefore, the information carried by the plurality of forward polarized spin waves can then be written into a plurality of register storage units of the register track in a plurality of sections of the register track that overlap the plurality of FLTs.

At 1506, the plurality of register storage units are shifted into a plurality of sections of the register track that overlap a plurality of BLTs. In some embodiments, the register storage units can be shifted via current-driven domain wall motion.

At 1508, a plurality of backward polarized spin waves are injected into the plurality of BLTs. The plurality of backward polarized spin waves can thus be modulated by the plurality of register storage units in the plurality of sections of the register track that overlap the plurality of BLTs to carry information, e.g., in the term of polarization directions of the backward polarized spin waves. Similar to that in the FLTs, depending on the polarization directions of the backward polarized spin waves, the logic-track domain wall of none, one, or more of the BLTs may be pushed to pass the data tracks. Therefore, the information carried by the backward polarized spin waves in the BLTs can be written into a plurality of output storage units in a plurality of sections of the plurality of data tracks that overlap the plurality of BLTs.

At 1510, whether the computation is finished is determined. If so (1510: YES), the process proceeds to 1512, at which the plurality of output storage units are shifted out of the sections of the data track that overlap the plurality of BLTs, for example, via domain wall motion, to output the data stored in the output storage units. On the other hand, if the computation is not finished yet (1510: NO), the process proceeds to 1514, at which the output storage units are shifted back to the plurality of sections of the data tracks that overlap the FLTs and hence become input storage units for the next computation cycle. The process then returns to 1504.

Although the processes shown in FIG. 15 are depicted as from one process to another, the present disclosure does not limit the order of the processes. For example, injecting the plurality of forward polarized spin waves (1504) can be performed before, approximately simultaneously with, or after the input storage units are shifted into the sections overlapping the FLTs (1502). Similarly, injecting the plurality of backward polarized spin waves (1508) can be performed before, approximately simultaneously with, or after the register storage units are shifted into the sections overlapping the BLTs (1506).

Other embodiments of the disclosure will be apparent to those skilled in the art from consideration of the specification and practice of the embodiments disclosed herein. It is intended that the specification and examples be considered as exemplary only and not to limit the scope of the disclosure, with a true scope and spirit of the invention being indicated by the following claims.

What is claimed is:

1. A computing device comprising:
    a logic track including two logic-track magnetic domains separated by a logic-track domain wall;
    an input track arranged crossing the logic track at a first position of the logic track, the input track including a plurality of input-track magnetic domains, and each of the plurality of input-track magnetic domains including at least one input-track storage unit configured to store binary 0 or 1; and
    an output track arranged crossing the logic track at a second position of the logic track, the output track including a plurality of output-track magnetic domains, and each of the plurality of output-track magnetic domains including at least one output-track storage unit configured to store binary 0 or 1;
    wherein the first position is closer to a spin wave injecting end of the logic track than the second position, and the second position is closer to the logic-track domain wall than the first position.

2. The device of claim 1, wherein the logic track includes:
    a first magnetic layer including:
        a first magnetic section in a first one of the two logic-track magnetic domains, a magnetization of the first magnetic section pointing in a first direction; and
        a second magnetic section in a second one of the two logic-track magnetic domains, a magnetization of the second magnetic section pointing in a second direction approximately opposite to the first direction; and
    a second magnetic layer arranged above the first magnetic layer and including:
        a third magnetic section in the first one of the two logic-track magnetic domains, a magnetization of the third magnetic section pointing in the second direction; and
        a fourth magnetic section in the second one of the two logic-track magnetic domains, a magnetization of the fourth magnetic section pointing in the first direction.

3. The device of claim 2, wherein a magnetization of each of the at least one input-track magnetic domain points approximately in the first direction or approximately in the second direction.

4. The device of claim 2, wherein the first direction and the second direction are approximately perpendicular to an upper surface of the logic track.

5. The device of claim 2, wherein the first direction and the second direction are approximately perpendicular to a side surface of the logic track.

6. The device of claim 2, wherein the first magnetic layer and the second magnetic layer have a same width.

7. The device of claim 2, wherein the first magnetic layer and the second magnetic layer are made of a same material.

8. The device of claim 2, wherein a saturation magnetization of the first magnetic layer is same as a saturation magnetization of the second magnetic layer.

9. The device of claim 2, wherein the magnetization of the first magnetic section is always approximately opposite to the magnetization of the second magnetic section, always approximately opposite to the magnetization of the third magnetic section, and always approximately same as the magnetization of the fourth magnetic section.

10. The device of claim 1, wherein a position of the logic-track domain wall is located at an interface between the two logic-track magnetic domains.

11. The device of claim 1, wherein the input track and the output track are approximately perpendicular to the logic track.

12. The device of claim 1, further comprising:
    an input-track driving device coupled to the input track and configured to drive one of the at least one input-track storage unit into and out of an overlapping section of the input track, the overlapping section of the input track being a section of the input track that overlaps the logic track; and
    an output-track driving device coupled to the output track and configured to drive one of the at least one output-track storage unit out of an overlapping section of the output track, the overlapping section of the output track being a section of the output track that overlaps the logic track.

13. The device of claim 1, further comprising:
    an instruction track arranged crossing the logic track, the instruction track being configured to change a polarization direction of a spin wave injected from the spin wave injecting end.

14. The device of claim 13, wherein the instruction track is arranged approximately perpendicular to the logic track.

15. The device of claim 13,
    wherein the instruction track is a first instruction track;
    the device further comprising:
        a second instruction track arranged crossing the logic track.

16. The device of claim 15, wherein:
    each of the first instruction track and the second instruction track includes a plurality of magnetic domains, a magnetization of each of the plurality of magnetic domains pointing in a first direction or in a second direction approximately opposite to the first direction; and
    a combination of the magnetization of one of the magnetic domains of the first instruction track that overlaps the logic track and the magnetization of one of the magnetic domains of the second instruction track that overlaps the logic track determines a rotation angle of the polarization direction of the spin wave.

17. The device of claim 15, wherein the first instruction track and the second instruction track are arranged approximately perpendicular to the logic track.

18. The device of claim 1, wherein:
the input track is a first input track, the plurality of input-track magnetic domains are a plurality of first input-track magnetic domains, and the at least one input-track storage unit is at least one first input-track storage unit; and
the output track is a first output track, the plurality of output-track magnetic domains are a plurality of first output-track magnetic domains, and the at least one output-track storage unit is at least one first output-track storage unit;
the device further comprising:
a second input track arranged crossing the logic track at a third position of the logic track, the second input track including at least one second input-track magnetic domain, and each of the at least one second input-track magnetic domain including at least one second input-track storage unit configured to store binary 0 or 1; and
a second output track arranged crossing the logic track at a position of the logic track that corresponds to the second position of the logic track and is near the logic-track domain wall, the second output track including at least one second output-track magnetic domain, each of the at least one second output-track magnetic domain including at least one second output-track storage unit configured to store binary 0 or 1.

19. The device of claim 18, wherein:
the first input track and the second input track are arranged approximately parallel to each other and approximately perpendicular to the logic track; and
the first output track and the second output track are arranged on opposite sides of the logic track and approximately parallel to each other, and approximately perpendicular to the logic track.

20. The device of claim 1, further comprising:
a spin wave generator configured to generate and inject a spin wave to the logic track through the spin wave injecting end of the logic track.

\* \* \* \* \*